(12) United States Patent
Yeo et al.

(10) Patent No.: US 11,974,455 B2
(45) Date of Patent: Apr. 30, 2024

(54) DISPLAY DEVICE AND METHOD OF MANUFACTURING THE SAME

(71) Applicant: Samsung Display Co., Ltd., Yongin-si (KR)

(72) Inventors: Myung Chul Yeo, Asan-si (KR); Yong Tack Kim, Yongin-si (KR); Eung Seok Park, Seoul (KR); Hee Wook Yoon, Gwacheon-si (KR); Yoon Hyeung Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 299 days.

(21) Appl. No.: 17/446,909

(22) Filed: Sep. 3, 2021

(65) Prior Publication Data
US 2022/0199948 A1   Jun. 23, 2022

(30) Foreign Application Priority Data
Dec. 17, 2020  (KR) .................. 10-2020-0177050

(51) Int. Cl.
*H01L 51/52*   (2006.01)
*H01L 27/32*   (2006.01)
(Continued)

(52) U.S. Cl.
CPC ....... *H10K 50/844* (2023.02); *H10K 50/8445* (2023.02); *H10K 50/85* (2023.02);
(Continued)

(58) Field of Classification Search
CPC .... H10K 59/122; H10K 59/38; H10K 59/873; H10K 59/8731; H10K 59/875;
(Continued)

(56) References Cited

U.S. PATENT DOCUMENTS

2019/0189969 A1* 6/2019 Youn .................. H10K 50/852
2019/0229289 A1* 7/2019 Kim ................... H10K 50/8445
(Continued)

FOREIGN PATENT DOCUMENTS

KR   10-2016-0080077 A  *  7/2016  ............ H01L 27/32
KR   10-2017-0077929 A     7/2017
(Continued)

OTHER PUBLICATIONS

Machine translation, Youn, Korean Pat. Pub. No. KR2016-0080077A, translation date: Aug. 24, 2023, Espacenet, all pages. (Year: 2023).*
(Continued)

*Primary Examiner* — Victoria K. Hall
(74) *Attorney, Agent, or Firm* — Lewis Roca Rothgerber Christie LLP

(57) ABSTRACT

A display device includes a substrate; a light-emitting element layer on the substrate; a first thin-film encapsulation layer that is on the light-emitting element layer, has an upper surface conforming an upper surface of the light-emitting element layer, and includes a recessed portion; a bank layer on the first thin-film encapsulation layer and having an opening overlapping the recessed portion; a wavelength conversion layer in the opening on the first thin-film encapsulation layer and at least partially in the recessed portion; a first inorganic layer on the bank layer and the wavelength conversion layer; an organic layer on the first inorganic layer; and a second inorganic layer on the organic layer.

20 Claims, 21 Drawing Sheets

(51) Int. Cl.
| | |
|---|---|
| *H01L 51/56* | (2006.01) |
| *H10K 50/844* | (2023.01) |
| *H10K 50/85* | (2023.01) |
| *H10K 50/858* | (2023.01) |
| *H10K 59/121* | (2023.01) |
| *H10K 59/122* | (2023.01) |
| *H10K 59/38* | (2023.01) |
| *H10K 71/00* | (2023.01) |
| *H10K 71/13* | (2023.01) |
| *H10K 59/12* | (2023.01) |

(52) U.S. Cl.
CPC ......... *H10K 50/858* (2023.02); *H10K 59/121* (2023.02); *H10K 59/122* (2023.02); *H10K 59/38* (2023.02); *H10K 71/00* (2023.02); *H10K 71/135* (2023.02); *H10K 59/1201* (2023.02)

(58) Field of Classification Search
CPC ............... H10K 59/879; H10K 50/844; H10K 50/8445; H10K 50/85; H10K 50/858
See application file for complete search history.

(56) References Cited

U.S. PATENT DOCUMENTS

2020/0013766 A1\* 1/2020 Kim ..................... H01L 25/167
2021/0104586 A1\* 4/2021 Baek ..................... H10K 71/00

FOREIGN PATENT DOCUMENTS

| KR | 10-2018-0030453 A | | 3/2018 | |
| KR | 10-2020-0054423 A | | 5/2020 | |
| KR | 10-2020-0072740 A | \* | 6/2020 | ......... G02B 27/0172 |
| KR | 10-2020-0072740 A | | 6/2020 | |

OTHER PUBLICATIONS

Machine translation, Kwangnam, Korean Pat. Pub. No. KR2020-0072740A, translation date: Aug. 22, 2023, Espacenet, all pages. (Year: 2023).\*

\* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2020-0177050 filed on Dec. 17, 2020 in the Korean Intellectual Property Office (KIPO), the entire disclosure of which is incorporated by reference herein.

BACKGROUND

1. Field

The present disclosure relates to a display device and a method of manufacturing the same.

2. Description of Related Art

The importance of display devices is increasing with the development of multimedia. Accordingly, various types (kinds) of display devices such as an organic light-emitting display (OLED) device, a liquid crystal display (LCD) device, and the like are being used. The application examples of such display devices are diversifying around various mobile electronic devices, for example, portable electronic devices such as smart phones, smart watches, tablet PCs, and the like.

In order to express various colors, the display devices may include a wavelength conversion member including pigment particles having a set color (e.g., a predetermined color) or a light-emitting body emitting light having a set color (e.g., a predetermined color). Light provided from a light-emitting element layer may be emitted to the outside through the wavelength conversion member.

SUMMARY

Aspects of one or more embodiments of the present disclosure are directed toward a display device and a method of manufacturing the display device, in which optical efficiency of light entering a wavelength conversion member from a light-emitting element is improved by encapsulating the light-emitting element through a thin-film encapsulation layer that is disposed between the light-emitting element and the wavelength conversion member and made of an inorganic material.

According to an embodiment of the present disclosure, a display device includes a substrate; a light-emitting element layer on the substrate; a first thin-film encapsulation layer that is on the light-emitting element layer, has an upper surface conforming to an upper surface of the light-emitting element layer, and includes a recessed portion; a bank layer on the first thin-film encapsulation layer and having an opening overlapping the recessed portion; a wavelength conversion layer in the opening on the first thin-film encapsulation layer and at least partially in the recessed portion; a first inorganic layer on the bank layer and the wavelength conversion layer; an organic layer on the first inorganic layer; and a second inorganic layer on the organic layer.

The first thin-film encapsulation layer may be substantially uniform in thickness.

A lower surface of the wavelength conversion layer may conform to the upper surface of the light-emitting element layer.

The substrate may include a display area in which a plurality of pixels are located and a non-display area around the display area. The first inorganic layer and the second inorganic layer may contact each other in the non-display area.

The first thin-film encapsulation layer and the first inorganic layer may contact each other in the non-display area.

The substrate may include an area in which a plurality of pixels are located. The display device may further include a pixel-defining film arranged along a boundary of each of the pixels, the pixel-defining film partially overlapping the bank layer. The first thin-film encapsulation layer may be between the pixel-defining film and the bank layer.

A width of the opening may decrease toward an upper side.

The bank layer may include a partition wall having a reverse-tapered structure.

The wavelength conversion layer may include a concave upper surface.

A refractive index of the first inorganic layer may be lower than a refractive index of the wavelength conversion layer.

The opening and the recessed portion may be spatially connected to each other.

According to an embodiment of the present disclosure, a display device includes a substrate including an area in which a plurality of pixels are located; a pixel-defining film along a boundary of each of the pixels; a light-emitting element layer on the substrate so as to cover the pixel-defining film; a first thin-film encapsulation layer on the light-emitting element layer, the first thin-film encapsulation layer including a recessed portion not overlapping the pixel-defining film in a thickness direction of the substrate; a wavelength conversion layer on the first thin-film encapsulation layer, the wavelength conversion layer being at least partially in the recessed portion; a first inorganic layer on the wavelength conversion layer; an organic layer on the first inorganic layer; and a second inorganic layer on the organic layer.

An upper surface of the first thin-film encapsulation layer may conform to an upper surface of the light-emitting element layer.

The first thin-film encapsulation layer may be substantially uniform in thickness.

A lower surface of the wavelength conversion layer may conform to an upper surface of the light-emitting element layer.

A display device may further include a bank layer on the first thin-film encapsulation layer, the bank layer having an opening partially overlapping the recessed portion and spatially connected thereto. At least a portion of the wavelength conversion layer may be in the opening.

A width of the opening may decrease toward an upper side.

The bank layer may include a partition wall having a reverse-tapered structure.

According to an embodiment of the present disclosure, a method of manufacturing a display device includes forming a light-emitting element layer on a substrate; forming a first thin-film encapsulation layer, on the light-emitting element layer, having an upper surface conforming to an upper surface of the light-emitting element layer and including a recessed portion; forming a bank layer having an opening on the first thin-film encapsulation layer; inkjet printing a wavelength conversion layer on the recessed portion and the opening; forming a first inorganic layer on the bank layer and the wavelength conversion layer; forming an organic layer on the first inorganic layer; and forming a second inorganic layer on the organic layer.

The opening may expose the recessed portion. The bank layer may include a partition wall having a reverse-tapered structure.

The same effect as a concave lens is provided to light emitted from a wavelength conversion member using an inorganic film disposed on an upper surface of the wavelength conversion member and having a downward concave shape. Accordingly, the light emitted from the wavelength conversion member is dispersed and emitted. Thus, aspects of the present disclosure also provide a display device and a method of manufacturing the display device, in which a viewing angle is increased, that is, an image may be viewed from various angles.

It should be noted that objects of the present disclosure are not limited to the above-described objects, and other objects of the present disclosure will be apparent to those skilled in the art from the following descriptions.

BRIEF DESCRIPTION OF THE DRAWINGS

The above and other aspects and features of the present disclosure will become more apparent by describing embodiments thereof in detail with reference to the attached drawings, in which.

DETAILED DESCRIPTION

Figure 1:
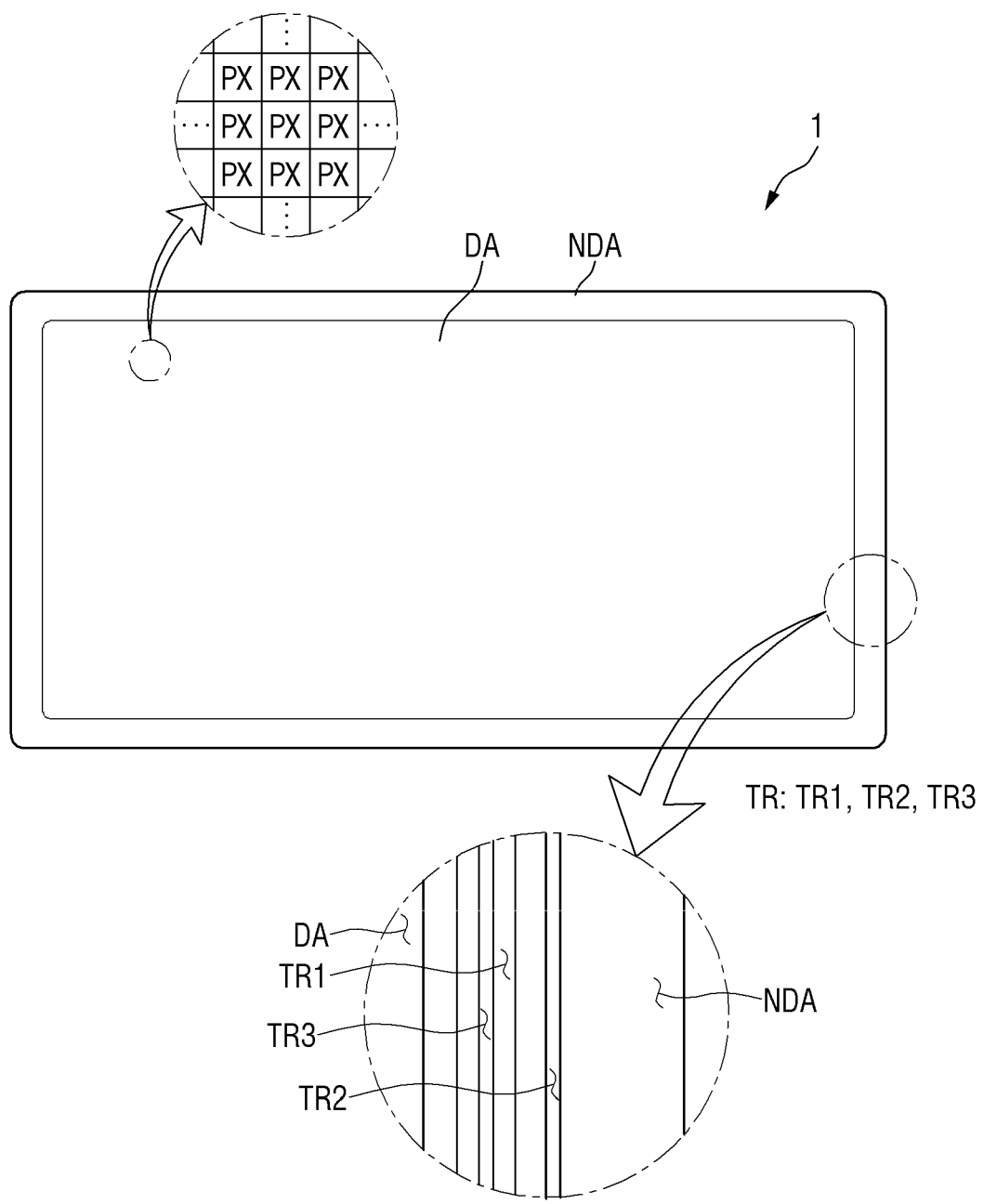
FIG. 1 is a plan view of a display device according to an embodiment.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will also be understood that when a layer is referred to as being "on" another layer or substrate, it can be directly on the other layer or substrate, or one or more intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present invention.

The same reference numbers indicate the same components throughout the specification, and duplicative descriptions thereof may not be provided.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, specific embodiments will be described with reference to the accompanying drawings.

FIG. 1 is a plan view of a display device according to an embodiment.

Referring to FIG. 1, a display device 1 displays a video or a still image. The display device 1 may refer to any electronic device that provides a display screen. For example, the display device 1 may include a television, a laptop computer, a monitor, an advertising panel, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and/or the like, which provide a display screen.

The display device 1 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although a case in which the inorganic light-emitting diode display panel is applied as the example of the display panel is described, the present disclosure is not limited thereto, and other suitable display panels may be applied.

A shape of the display device 1 may be variously modified in a suitable manner. For example, the display device 1 may have shapes such as a rectangular shape of which lateral sides are long, a rectangular shape of which longitudinal sides are long, a square shape, a quadrangular shape of which corner portions (vertexes) are rounded, other polygonal shapes, a circular shape, and/or the like. A shape of a display area DA of the display device 1 may also be similar to an overall shape of the display device 1. In FIG. 1, the display device 1 and the display area DA, each of which has a rectangular shape of which longitudinal sides are long, are illustrated.

The display device 1 may include the display area DA and a non-display area NDA. The display area DA is an area in which an image may be displayed, and the non-display area NDA is an area in which an image is not displayed. The display area DA may refer to an active area and the non-display area NDA may refer to an inactive area. In general, the display area DA may occupy or substantially occupy a center portion of the display device 1.

The display area DA may include a plurality of pixels PX. The plurality of pixels PX may be arranged in a matrix form. A shape of each of the pixels PX may be a rectangular shape or a square shape in a plan view, but the present disclosure is not limited thereto, and the shape may be a rhombus shape of which each side is inclined with respect to one direction.

The pixels PX may be alternately arranged in a stripe type or a PenTile® type (PENTILE® is a registered trademark of Samsung Display Co., Ltd., Republic of Korea).

The non-display area NDA may be disposed around the display area DA. The non-display area NDA may completely or partially surround the display area DA. The display area DA may have a rectangular shape, and the non-display area NDA may be arranged to be adjacent to four sides of the display area DA. The non-display area NDA may form a bezel of the display device 1. In each non-display area NDA, lines or circuit drivers included in the display device 1 may be disposed, or external devices may be mounted.

The non-display area NDA may include a trench TR. As will be described below, the trench TR may prevent or substantially prevent an organic material for forming a first organic layer 172 from overflowing to the outside when the first organic layer 172 (e.g., see in FIG. 2) is formed, and may prevent or substantially prevent a crack from occurring due to an external impact.

The trench TR may be formed in the non-display area NDA and may be around (e.g., surround) the display area DA. In FIG. 1, the trench TR is illustrated as having an integrated structure that is disposed to be around (e.g., to surround) the display area DA, but the present disclosure is not limited thereto, and the trench TR may have a structure in which a plurality of isolated grooves are spaced from each other at regular intervals.

The trench TR may include a first trench TR1, a second trench TR2 disposed further outward (e.g., outward relative to a center of the display device 1) than the first trench TR1, and a third trench TR3 disposed further inward (e.g., inward relative to the center of the display device 1) than the first trench TR1. For example, the first trench TR1 may be between the second trench TR2 and the third trench TR3. This will be described in detail below.

Figure 2:
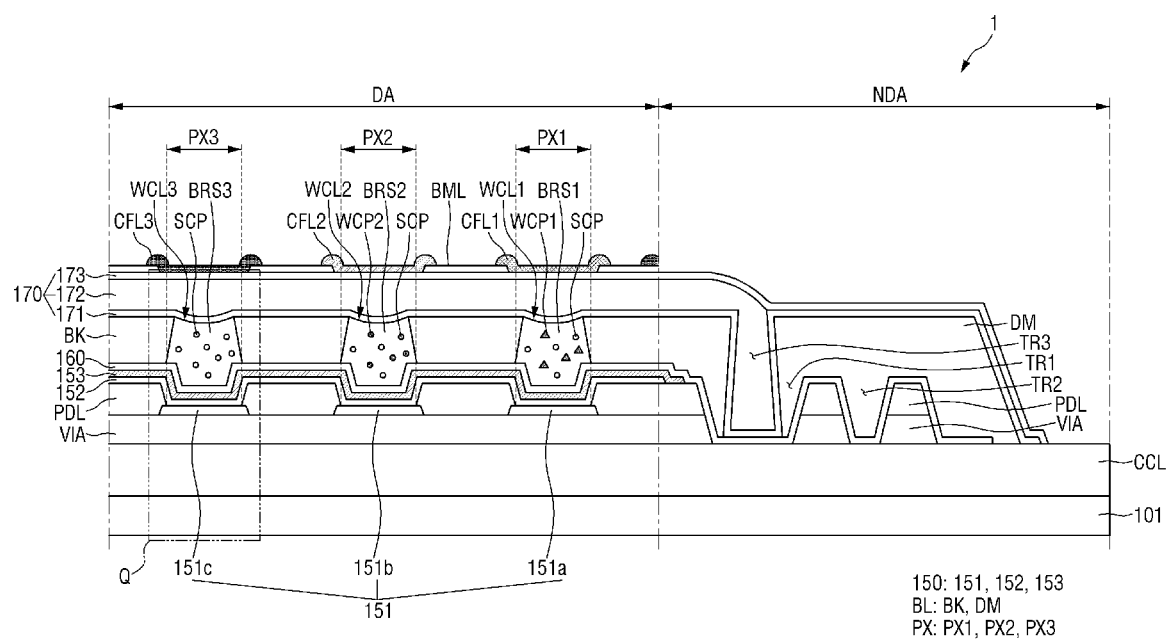
FIG. 2 is a cross-sectional view of the display device according to an embodiment.
Figure 3:
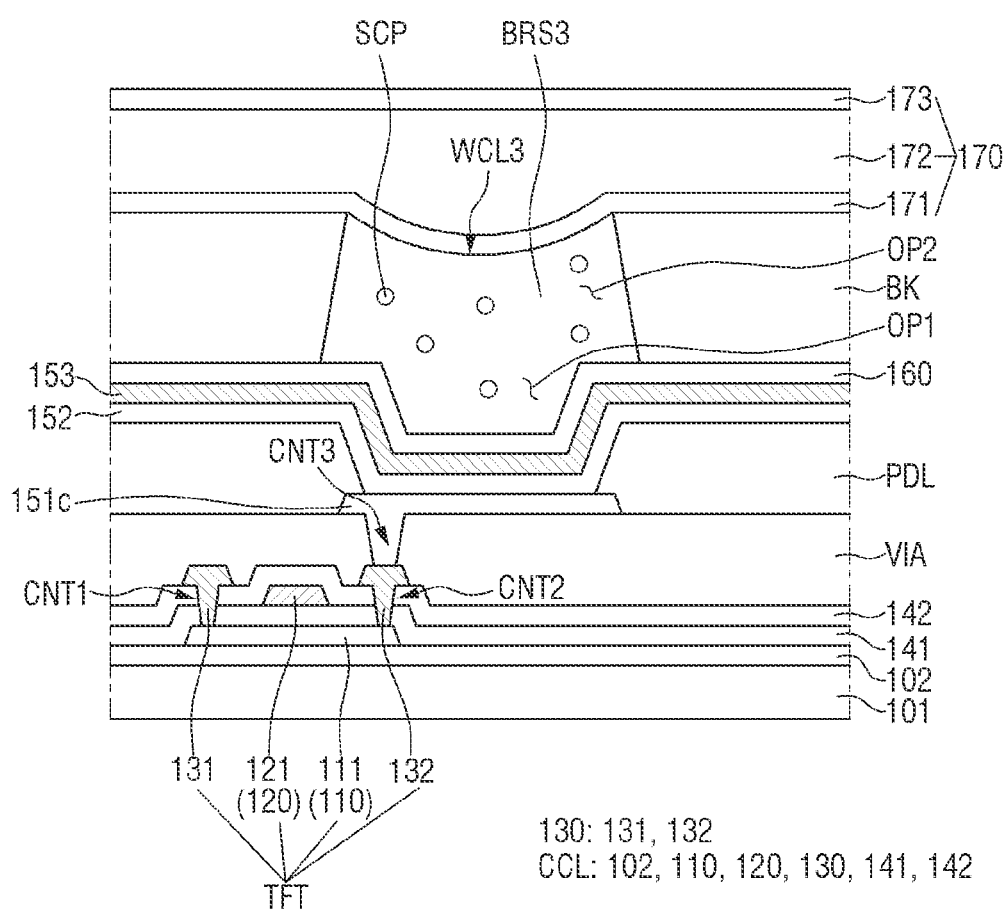
FIG. 3 is a cross-sectional view of a pixel of the display device according to an embodiment.

FIG. 2 is a cross-sectional view of the display device according to an embodiment. FIG. 3 is a cross-sectional view of a pixel of the display device according to an embodiment.

Referring to FIGS. 2 and 3, the display device 1 may include a base substrate 101, a buffer layer 102, a semiconductor layer 110, a gate insulating film 141, a first conductive layer 120, an interlayer insulating film 142, a second conductive layer 130, a via layer VIA, a pixel electrode 151, a pixel-defining film PDL, a light-emitting layer 152, a common electrode 153, a first thin-film encapsulation layer 160, a bank layer BL, a wavelength conversion layer WCL, a second thin-film encapsulation layer 170, and a color filter layer CFL that are disposed (e.g., sequentially disposed). The display device 1 according to an embodiment may be manufactured by stacking (e.g., sequentially stacking) the above-described layers on the base substrate 101. In an embodiment, the base substrate 101 may be one substrate.

Each of the above-described layers may be formed as a single film or a stacked film including a plurality of films. Another layer may be further disposed between the above-described layers.

The base substrate 101 supports the layers disposed thereon. The base substrate 101 may be made of, for example, an insulating material such as a polymer resin. The base substrate 101 is not limited thereto, and may include a metal material. In the non-display area NDA, the base substrate 101 may extend further outward (e.g., outward relative to the center of the display device 1) than the first thin-film encapsulation layer 160, the second thin-film encapsulation layer 170, and a dam DM, which will be described below.

The base substrate 101 may be a flexible substrate that is bendable, foldable, and/or rollable. Examples of materials forming the flexible substrate may include polyimide (PI), but the present disclosure is not limited thereto.

The buffer layer 102 may be disposed on the base substrate 101. The buffer layer 102 may prevent or reduce diffusion of impurity ions, prevent or reduce permeation of moisture or external air, and perform a surface planarization function. The buffer layer 102 may include silicon nitride, silicon oxide, silicon oxynitride, and/or the like. The buffer layer 102 may be omitted depending on the type, process conditions, and/or the like of the base substrate 101.

The semiconductor layer 110 may be disposed on the buffer layer 102. The semiconductor layer 110 may include a semiconductor pattern 111. The semiconductor pattern 111 may include a channel area overlapping a gate electrode 121, which will be described below, in a thickness direction of the base substrate 101, and a first source/drain area and a second source/drain area respectively located at respective sides of the channel area. Each of the first and second source/drain areas includes a plurality of carrier ions, and thus may have a higher conductivity and a lower electrical resistance than the channel area.

The semiconductor layer 110 may be made of polycrystalline silicon, single-crystal silicon, amorphous silicon, and/or the like.

The gate insulating film 141 may be disposed on the semiconductor layer 110. The gate insulating film 141 may cover not only an upper surface of the semiconductor pattern 111 (except for a portion in which first and second contact holes CNT1 and CNT2 are formed), but also a side surface of the semiconductor pattern 111. The gate insulating film 141 may be disposed over the surface of the base substrate 101 (e.g., roughly over the entire surface of the base substrate 101).

The gate insulating film 141 may include a silicon compound, a metal oxide, and/or the like. For example, the gate insulating film 141 may include silicon oxide, silicon nitride, silicon oxynitride, aluminum oxide, tantalum oxide, hafnium oxide, zirconium oxide, titanium oxide, and/or the like. These may be used alone or in combination with each other.

The first conductive layer 120 may be disposed on the gate insulating film 141. The first conductive layer 120 may be a gate conductive layer and may include the gate electrode 121.

The first conductive layer 120 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The interlayer insulating film 142 may be disposed on the first conductive layer 120. The interlayer insulating film 142 may cover not only an upper surface of the gate electrode 121 (except for a portion in which the first and second contact holes CNT1 and CNT2 are formed), but also a side surface of the gate electrode 121. The interlayer insulating film 142 may be disposed over the surface of the gate insulating film 141 (e.g., roughly over the entire surface of the gate insulating film 141).

The interlayer insulating film 142 may include a silicon compound, a metal oxide, and/or the like. For example, the interlayer insulating film 142 may include silicon oxide, silicon nitride, silicon oxynitride, aluminum oxide, tantalum oxide, hafnium oxide, zirconium oxide, titanium oxide, and/or the like. These may be used alone or in combination with each other.

The second conductive layer 130 may be disposed on the interlayer insulating film 142. The second conductive layer 130 may be a data conductive layer and may include a data line through which a data signal is applied. The second conductive layer 130 may include a first source/drain electrode 131 and a second source/drain electrode 132 of a transistor.

The first source/drain electrode 131 may be connected to the first source/drain area of the semiconductor pattern 111 through the first contact hole CNT1 that passes through the interlayer insulating film 142 and the gate insulating film 141 and exposes the first source/drain area of the semiconductor pattern 111.

The second source/drain electrode 132 may be connected to the second source/drain area of the semiconductor pattern 111 through the second contact hole CNT2 that passes through the interlayer insulating film 142 and the gate insulating film 141 and exposes the second source/drain area of the semiconductor pattern 111.

The second conductive layer 130 may include one or more metals selected from among aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The semiconductor pattern 111, the gate electrode 121, the first source/drain electrode 131, and the second source/drain electrode 132 described above may form a thin-film transistor TFT.

In addition, the buffer layer 102, the semiconductor layer 110, the gate insulating film 141, the first conductive layer 120, the interlayer insulating film 142, and the second conductive layer 130 may form a circuit layer CCL. Hereinafter, the buffer layer 102, the semiconductor layer 110, the gate insulating film 141, the first conductive layer 120, the interlayer insulating film 142, and the second conductive layer 130 may be briefly referred to as the circuit layer CCL. In the non-display area NDA, the circuit layer CCL may be disposed on the base substrate 101 and may extend further outward (e.g., outward relative to a center of the display device 1) than the first thin-film encapsulation layer 160, the second thin-film encapsulation layer 170, and the dam DM, which will be described below. Accordingly, the circuit layer CCL may be exposed (e.g., partially exposed) and a pad to which a signal is applied from the outside may be disposed in the exposed area.

The via layer VIA may be disposed on the second conductive layer 130. The via layer VIA may be disposed above the second conductive layer 130 and may completely cover an upper surface of the interlayer insulating film 142. When the via layer VIA is formed of an organic film, an upper surface of the via layer VIA may be flat (e.g., partially flat) despite a stepped portion therebelow. In addition, the via layer VIA may allow transmission (e.g., partial transmission) of light therethrough. For example, the via layer VIA may include a transparent planarization layer.

The via layer VIA may include an organic insulating material such as an acrylic resin (polyacrylate-based resin), an epoxy resin, a phenolic resin, a polyamide-based resin, a polyimide-based resin, an unsaturated polyester-based resin, a poly phenylenether-based resin, a polyphenylene sulfide-based resin, and/or benzo cyclobutene (BCB).

The pixel electrode 151 may be disposed on the via layer VIA. The pixel electrode 151 may be an anode. The pixel electrode 151 may be separately disposed for each pixel PX.

As described above, the display area DA of the display device 1 may include the plurality of pixels PX. In an embodiment, the plurality of pixels PX may include a first pixel PX1 emitting light of a first color, a second pixel PX2 emitting light of a second color, and a third pixel PX3 emitting light of a third color. In an embodiment, the first color may be red, the second color may be green, and the third color may be blue.

The pixel electrode 151 may be connected to the second source/drain electrode 132 through a third contact hole CNT3 that passes through the via layer VIA and exposes the second source/drain electrode 132. The pixel electrode 151 may include a first pixel electrode 151a disposed in the first pixel PX1, a second pixel electrode 151b disposed in the second pixel PX2, and a third pixel electrode 151c disposed in the third pixel PX3.

The pixel electrode 151 may have, but is not limited to, a stacked film structure formed by stacking a material layer having a high work function and a reflective material layer. The material layer having a high work function is made of at least one of indium tin oxide (ITO), indium zinc oxide (IZO), zinc oxide (ZnO), or indium oxide ($In_2O_3$), and the reflective material layer is made of one selected from silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), and mixtures thereof. The layer having a high work function may be disposed above the reflective material layer and disposed close to the light-emitting layer 152. The pixel electrode 151 may have a stacked structure of ITO/Mg, ITO/MgF, ITO/Ag, and ITO/Ag/ITO, but the present disclosure is not limited thereto.

The pixel-defining film PDL may be disposed on the pixel electrode 151. The pixel-defining film PDL may be disposed along a boundary of each pixel PX. The pixel-defining film PDL may expose (e.g., partially expose) the pixel electrode 151. The pixel-defining film PDL may cover (e.g., partially cover) the pixel electrode 151 and the via layer VIA.

The display device 1 according to an embodiment may include the first trench TR1 and the second trench TR2 disposed in the non-display area NDA and passing through the via layer VIA and the pixel-defining film PDL. The first trench TR1 and the second trench TR2 may expose (e.g., partially expose) the circuit layer CCL. The second trench TR2 may be located further outward (e.g., outward relative to a center of the display device 1) than the first trench TR1. An inner width of the first trench TR1 may be greater than an inner width of the second trench TR2.

The first trench TR1 may serve to prevent or substantially prevent an organic material for forming the first organic layer 172 from overflowing to the outside when the first organic layer 172, which will be described below, is formed. The second trench TR2 may prevent or substantially prevent a crack from occurring in the display device 1 due to an external impact. That is, a portion of the via layer VIA and the pixel-defining film PDL, which are disposed on an inner side and an outer side of the second trench TR2, may be a crack prevention structure.

The pixel-defining film PDL may be made of an organic insulating material or an inorganic insulating material. For example, the pixel-defining film PDL may include at least one of a polyimide-based resin, an acrylic-based resin, a silicon compound, or a polyacrylic-based resin.

The light-emitting layer 152 may be disposed on the pixel-defining film PDL and the pixel electrode 151. The light-emitting layer 152 may be disposed entirely without distinguishing the pixels PX. In an embodiment, the light-emitting layer 152 may overlap the pixels PX in a thickness direction of the base substrate 101.

The light-emitting layer 152 may include an organic material layer. The organic material layer may include an organic light-emitting layer and may further include a hole injection/transport layer and an electron injection/transport layer.

The organic material layer may be disposed on the pixel electrode 151 exposed by the pixel-defining film PDL. For example, the organic material layer may cover (e.g., partially cover) an upper surface of the pixel electrode 151 and a side surface of the pixel-defining film PDL. On the other hand, the hole injection/transport layer and the electron injection/transport layer may be disposed entirely without distinguishing the pixels PX. In an embodiment, the hole injection/transport layer and the electron injection/transport layer may overlap the pixels PX in a thickness direction of the base substrate 101.

However, the present disclosure is not limited thereto, and the light-emitting layer 152 may be separately disposed for each pixel PX. For example, the light-emitting layer 152 may be disposed on the pixel electrode 151 exposed by the pixel-defining film PDL, and may cover (e.g., partially cover) the upper surface of the pixel electrode 151 and the side surface of the pixel-defining film PDL.

As described above, the light-emitting layer 152 may be disposed in the display area DA (e.g., disposed in the entirety of the display area) and extend to the non-display area NDA (e.g., extend only partially into the non-display area NDA). An outer edge of the light-emitting layer 152, which is disposed in the non-display area NDA, may be covered by the common electrode 153 and the first thin-film encapsulation layer 160, which will be described below. As will be described below, the light-emitting layer 152 may be encapsulated by the first thin-film encapsulation layer 160.

The common electrode 153 may be disposed on the light-emitting layer 152. The common electrode 153 may be disposed entirely without distinguishing the pixels PX. In an embodiment, the common electrode 153 may overlap the pixels PX in a thickness direction of the base substrate 101. The common electrode 153 may be a cathode.

The common electrode 153 may include a material layer having a low work function, which is made of one selected from among Li, Ca, LiF/Ca, LiF/Al, Al, Mg, Ag, Pt, Pd, Ni, Au Nd, Ir, Cr, BaF, Ba, and compounds or mixtures thereof (for example, a mixture of Ag and Mg). The common electrode 153 may further include a transparent metal oxide layer disposed on the material layer having a low work function.

The pixel electrode 151, the light-emitting layer 152, and the common electrode 153 may form a light-emitting element layer 150.

The first thin-film encapsulation layer 160 may be disposed above the common electrode 153. The first thin-film encapsulation layer 160 may encapsulate the light-emitting element layer 150 therebelow. For example, the first thin-film encapsulation layer 160 may encapsulate the light-emitting layer 152 of the light-emitting element layer 150.

In some embodiments, a lower surface of the first thin-film encapsulation layer 160 may contact (i.e., be in contact with) the light-emitting element layer 150, and an upper surface of the first thin-film encapsulation layer 160 may be in contact with the wavelength conversion layer WCL and the bank layer BL, which will be described below. However, the present disclosure is not limited thereto, and another layer may be interposed between the first thin-film encapsulation layer 160 and the light-emitting element layer 150 and/or between the first thin-film encapsulation layer 160 and the wavelength conversion layer WCL.

The upper surface of the first thin-film encapsulation layer 160 may include a stepped portion that is recessed downward in an area overlapping the pixel electrode 151. The stepped portion of the upper surface of the first thin-film encapsulation layer 160 may be formed by the pixel-defining film PDL exposing (e.g., partially exposing) the above-described pixel electrode 151. The upper surface of the first thin-film encapsulation layer 160 may be parallel to an upper surface of the light-emitting element layer 150. For example, the upper surface of the first thin-film encapsulation layer 160 (e.g., a portion of the first thin-film encapsulation layer 160) may be parallel to an upper surface of the common electrode 153 (e.g., an adjacent portion of the upper surface of the common electrode 153).

In other words, the upper surface of the first thin-film encapsulation layer 160 may conform to (i.e., be conformally disposed with respect to) an upper surface of an underlying structure (e.g., the upper surface of the common electrode 153 and/or the light-emitting layer 152). For example, the upper surface of the first thin-film encapsulation layer 160 may conform to the upper surface of the common electrode 153, and may conform to an upper surface of the light-emitting layer 152. The upper surface of the first thin-film encapsulation layer 160 may conform to the upper surface of the pixel electrode 151 and an upper surface and the side surface of the pixel-defining film PDL overlapping for or at each area.

In addition, a thickness t1 of the first thin-film encapsulation layer 160 (e.g., see FIG. 4) may have a uniform or substantially uniform value for or at each area. Accordingly, the upper surface and the lower surface of the first thin-film encapsulation layer 160 may conform to each other. The thickness t1 of the first thin-film encapsulation layer 160 will be described below in detail with reference to FIG. 4.

The first thin-film encapsulation layer 160 may include a recessed portion OP1 recessed (e.g., partially recessed) downward. The recessed portion OP1 may overlap the pixel electrode 151, and may not overlap the pixel-defining film PDL. However, the present disclosure is not limited thereto, and an outer edge of the recessed portion OP1 may overlap (e.g., partially overlap) the pixel-defining film PDL. The recessed portion OP1 may overlap an opening OP2, which will be described below, and may be spatially connected thereto.

In the non-display area NDA, the first thin-film encapsulation layer 160 may be disposed on the pixel-defining film PDL and the via layer VIA, and may be in contact (e.g., direct contact) with the circuit layer CCL through the first trench TR1 and the second trench TR2 passing through the pixel-defining film PDL and the via layer VIA. However, the present disclosure is not limited thereto, and another layer may be interposed between the first thin-film encapsulation layer 160 and the circuit layer CCL in the first trench TR1. In the non-display area NDA, the first thin-film encapsulation layer 160 may cover the pixel-defining film PDL and the via layer VIA, and the first thin-film encapsulation layer 160 may be disposed further outward (e.g., outward relative to a center of the display device 1) than each of the pixel-defining film PDL and the via layer VIA. For example, in the non-display area NDA, an edge of the first thin-film encapsulation layer 160 may be disposed further outward (e.g., outward relative to a center of the display device 1) than an edge of each of the pixel-defining film PDL and the via layer VIA.

The first thin-film encapsulation layer 160 may be an inorganic film made of an inorganic material. For example, the first thin-film encapsulation layer 160 may include silicon nitride, silicon oxide, silicon oxynitride, and/or the like.

The first thin-film encapsulation layer 160 may have a water vapor transmission rate of about $10^{-5}$ g/m²/day or less. Thus, it is possible to effectively prevent or substantially prevent moisture or external air from permeating into the light-emitting element layer 150.

The first thin-film encapsulation layer 160 may have a refractive index of about 1.6 or less. For example, the first thin-film encapsulation layer 160 may have a refractive index of about 1.2 to about 1.3.

The bank layer BL may be disposed on the first thin-film encapsulation layer 160. The bank layer BL may include a partition wall BK and the opening OP2 that is disposed inside the partition wall BK and configured to expose the first thin-film encapsulation layer 160. The partition wall BK may be disposed along the boundary of the pixel PX.

In an embodiment, the partition wall BK may have a reverse-tapered structure in which a cross-sectional area of the partition wall BK decreases from an upper side to a lower side. Meanwhile, a width of the opening OP2 may decrease from a lower side to an upper side. The opening OP2 may overlap (e.g., partially overlap) the recessed portion OP1 and may be spatially connected thereto.

The bank layer BL may further include the dam DM disposed in the non-display area NDA. The dam DM may prevent or substantially prevent an organic material, which is for forming the first organic layer 172, from overflowing to the outside when the first organic layer 172, which will be described below, is formed. The dam DM may include an inclined outer side surface. The outer edge of the dam DM may be disposed further outward (e.g., outward relative to a center of the display device 1) than an outer edge of the first thin-film encapsulation layer 160. A first inorganic layer 171 and a second inorganic layer 173 may be disposed on the dam DM. The first inorganic layer 171 and the second inorganic layer 173 may also be disposed on the inclined outer side surface of the dam DM.

The display device 1 according to an embodiment may include the third trench TR3 disposed in the non-display area NDA and passing through the bank layer BL. In the bank layer BL, the partition wall BK may be disposed at an inner side of the third trench TR3, and the dam DM may be disposed at an outer side of the third trench TR3.

The third trench TR3 may overlap the first trench TR1. The third trench TR3 may be disposed inside the first trench TR1. An inner width of the third trench TR3 may be less than the inner width of the first trench TR1. A bottom surface of the third trench TR3 may be located on a bottom surface of the first trench TR1.

The inner width of the third trench TR3 may decrease from a lower side to an upper side.

A portion of the dam DM may be disposed inside the first trench TR1. A portion of the partition wall BK may also be disposed inside the first trench TR1. For example, in the first trench TR1, a portion of the partition wall BK may be disposed on an inner side of the display device 1, and the dam DM may be disposed on an outer side of the display device 1.

The wavelength conversion layer WCL may be disposed inside the recessed portion OP1 and the opening OP2. The wavelength conversion layer WCL may transmit light provided from the light-emitting element layer 150 or convert a wavelength of the light provided from the light-emitting element layer 150.

In an embodiment, the wavelength of light emitted from the light-emitting element layer 150 may be the same for each pixel PX. For example, the display device 1 may display a color for each pixel PX by emitting blue light or ultraviolet light by the light-emitting element layer 150 of each pixel PX and including the wavelength conversion layer WCL.

In another embodiment, the wavelength of light emitted by each light-emitting element layer 150 may be different for each pixel PX. For example, the light-emitting element layer 150 disposed on the first pixel PX1 may emit light of a first color, the light-emitting element layer 150 disposed on the second pixel PX2 may emit light of a second color, and the light-emitting element layer 150 disposed on the third pixel PX3 may emit light of a third color.

The wavelength conversion layer WCL may overlap the light-emitting element layer 150. The wavelength conversion layer WCL may be disposed inside the recessed portion OP1 as well as the opening OP2. The wavelength conversion layer WCL may be formed by an inkjet printing process using the partition wall BK, but the present disclosure is not limited thereto.

At least a portion of the wavelength conversion layer WCL may be disposed in the recessed portion OP1. In other words, at least a portion of the wavelength conversion layer WCL may be disposed to be surrounded by the first thin-film encapsulation layer 160.

An upper surface of the wavelength conversion layer WCL may have a downward concave shape. A height of the upper surface of the wavelength conversion layer WCL may be reduced from an edge of the wavelength conversion layer WCL toward a central portion of the wavelength conversion layer WCL. As will be described below, the shape of the upper surface of the wavelength conversion layer WCL may be formed through a process of printing a material, forming the wavelength conversion layer WCL, in an ink form, and then curing the material.

The wavelength conversion layer WCL may include a first wavelength conversion pattern WCL1 disposed in the first pixel PX1, a second wavelength conversion pattern WCL2 disposed in the second pixel PX2, and a third wavelength conversion pattern WCL3 disposed in the third pixel PX3.

The first wavelength conversion pattern WCL1 may convert a wavelength of the light of the third color incident from the light-emitting element layer 150 into a wavelength of the light of the first color. The second wavelength conversion pattern WCL2 may convert the wavelength of the light of the third color light incident from the light-emitting element layer 150 into a wavelength of the light of the second color. The third wavelength conversion pattern WCL3 may be a light-transmitting layer, and may not convert the wavelength of the incident light of the third color.

The wavelength conversion patterns WCL1, WCL2, and WCL3 may include base resins BRS1, BRS2, and BRS3, respectively, and include scatterers SCP dispersed in the base resin BRS1, BRS2, or BRS3. The first and second wavelength conversion patterns WCL1 and WCL2 may further include wavelength conversion particles WCP1 and WCP2 respectively disposed in the base resins BRS1 and BRS2. The base resins BRS1 and BRS2 may each include a transparent organic material. The wavelength conversion particles WCP1 and WCP2 may be quantum dots, quantum rods, phosphors, and/or the like. The quantum dots may include IV group-based nanocrystals, II-VI group-based compound nanocrystals, III-V group-based compound nanocrystals, IV-VI group-based nanocrystals, or combinations thereof.

The second thin-film encapsulation layer 170 may be disposed on the bank layer BL and the wavelength conversion layer WCL. The second thin-film encapsulation layer 170 may encapsulate the wavelength conversion layer WCL therebelow.

The second thin-film encapsulation layer 170 may include the first inorganic layer 171, the first organic layer 172 disposed on the first inorganic layer 171, and the second inorganic layer 173 disposed on the first organic layer 172. The first inorganic layer 171 and the second inorganic layer 173 may be in contact with each other in the non-display area NDA. For example, the first inorganic layer 171 and the second inorganic layer 173 may be in contact with each other on the dam DM. Thus, the first organic layer 172 may be sealed by the first inorganic layer 171 and the second inorganic layer 173.

In the non-display area NDA, the first inorganic layer 171 may be disposed on the partition wall BK and the dam DM. The first inorganic layer 171 may also be disposed on the inclined outer side surface of the dam DM. An outer edge of the first inorganic layer 171 may be located further outward (e.g., outward relative to a center of the display device 1) than the outer edge of the dam DM and may be disposed on the circuit layer CCL. In addition, the first inorganic layer 171 may pass through the bank layer BL through the third trench TR3 and may be connected (e.g., directly connected) to the first thin-film encapsulation layer 160. The first inorganic layer 171 may be in contact (e.g., direct contact) with the second inorganic layer 173 on the dam DM.

A lower surface of the first inorganic layer 171 may be in contact with the wavelength conversion layer WCL. The lower surface of the first inorganic layer 171 overlapping the wavelength conversion layer WCL may have the same shape as the upper surface of the wavelength conversion layer WCL. That is, the lower surface of the first inorganic layer 171 overlapping the wavelength conversion layer WCL may have a downward concave shape.

In the display area DA, the first organic layer 172 may include a flat upper surface. On the other hand, in the non-display area NDA, the first organic layer 172 may include an upper surface curved downward. For example, the first organic layer 172 may have the upper surface whose height decreases toward the outside in an area overlapping the third trench TR3. The first organic layer 172 may not be disposed further outward (e.g., outward relative to a center of the display device 1) than the third trench TR3, but is not limited thereto, and in some cases, may be disposed (e.g., partially disposed) further outward (e.g., outward relative to a center of the display device 1) than the third trench TR3 when the organic material for forming the first organic layer 172 is filled in the third trench TR3 and then excessively applied to overflow outward (e.g., outward relative to a center of the display device 1).

The first organic layer 172 may be filled in the third trench TR3. As described above, when the first organic layer 172 is formed, the organic material for forming the first organic layer 172 is filled in the third trench TR3, and the organic material may be prevented or substantially prevented from overflowing to the outside by the dam DM.

The second inorganic layer 173 may be disposed on the first organic layer 172 in the display area DA and may include flat upper and lower surfaces. The second inorganic layer 173 may have a uniform or substantially uniform thickness for or at each area.

In the non-display area NDA, the second inorganic layer 173 may be disposed on the curved upper surface of the first organic layer 172. The second inorganic layer 173 may extend further outward (e.g., outward relative to a center of the display device 1) than the first organic layer 172 and extend onto the first inorganic layer 171 disposed on the dam DM. The second inorganic layer 173 may be in contact with the first inorganic layer 171 on the dam DM. The second inorganic layer 173 may cover the outer edge of the first inorganic layer 171 disposed on the circuit layer CCL. An outer edge of the second inorganic layer 173 may be disposed further outward (e.g., outward relative to a center of the display device 1) than the outer edge of the first inorganic layer 171.

Each of the first inorganic layer 171 and the second inorganic layer 173 may include silicon nitride, silicon oxide, silicon oxynitride, and/or the like. The first inorganic layer 171 and the second inorganic layer 173 may be made of the same material. In addition, the first inorganic layer 171 and the second inorganic layer 173 may be made of the same material as the first thin-film encapsulation layer 160. The first organic layer 172 may include an organic insulating material.

A light blocking member BML may be disposed on the second thin-film encapsulation layer 170 along the boundary of the pixel PX. The light blocking member BML may overlap the pixel-defining film PDL. The light blocking member BML may be formed in a lattice shape in a plan view and may include an opening that exposes (e.g., partially exposes) an upper surface of the second thin-film encapsulation layer 170.

The color filter layer CFL may be disposed on one surface of the second thin-film encapsulation layer 170 exposed (e.g., partially exposed) through the opening of the light blocking member BML.

The color filter layer CFL may include a first color filter layer CFL1 disposed in the first pixel PX1, a second color filter layer CFL2 disposed in the second pixel PX2, and a third color filter layer CFL3 disposed in the third pixel PX3. Each color filter layer CFL may include a colorant such as a dye and/or a pigment that absorbs wavelengths other than a corresponding color wavelength (e.g., a wavelength corresponding to a color to be transmitted by the corresponding pixel). The first color filter layer CFL1 may be a red color filter layer, the second color filter layer CFL2 may be a green color filter layer, and the third color filter layer CFL3 may be a blue color filter layer.

In one or more embodiments, the display device 1 may further include a capping layer that is disposed on the color filter layer CFL and prevents or reduces the permeation of impurities such as moisture or air.

Figure 4:
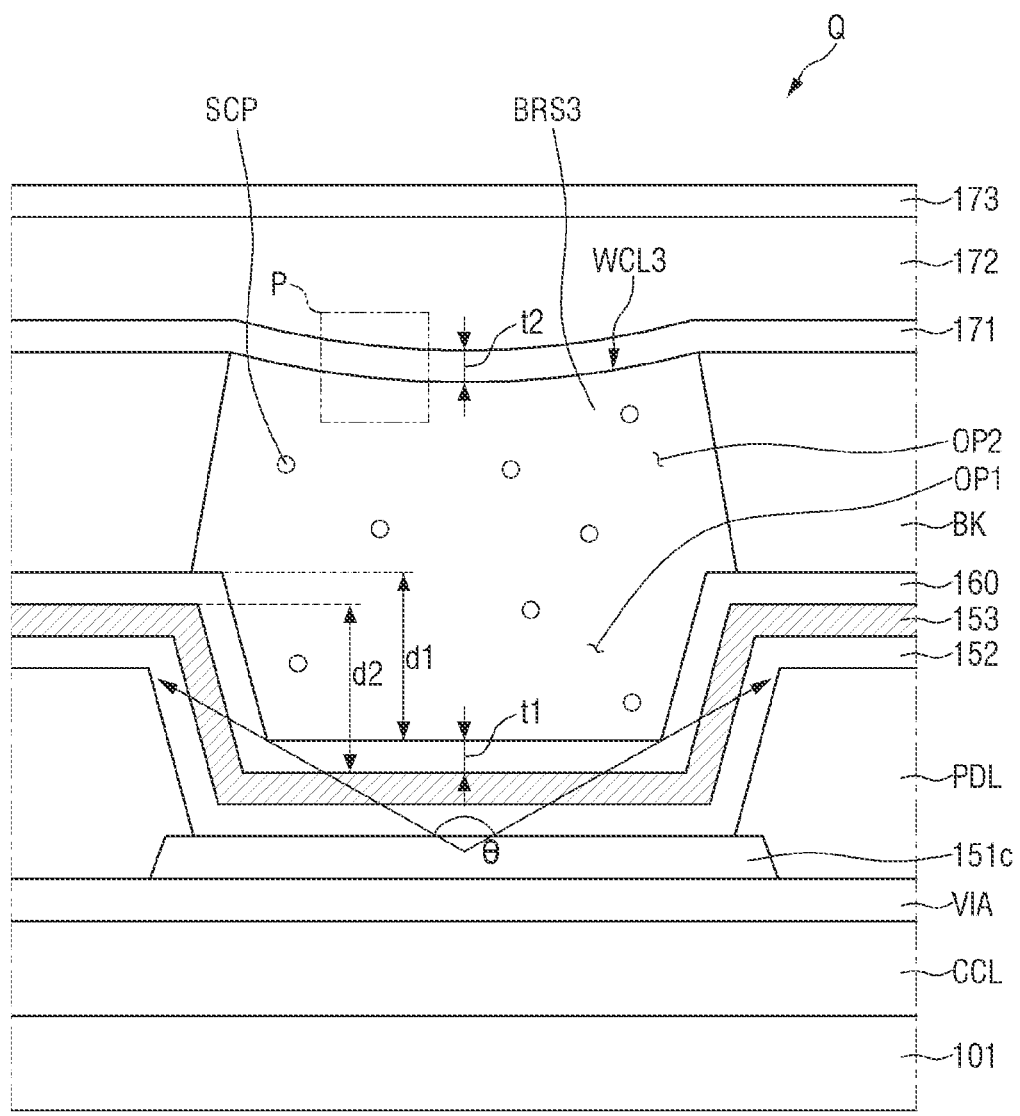
FIG. 4 is an enlarged view of area Q of FIG. 2.
Figure 5:
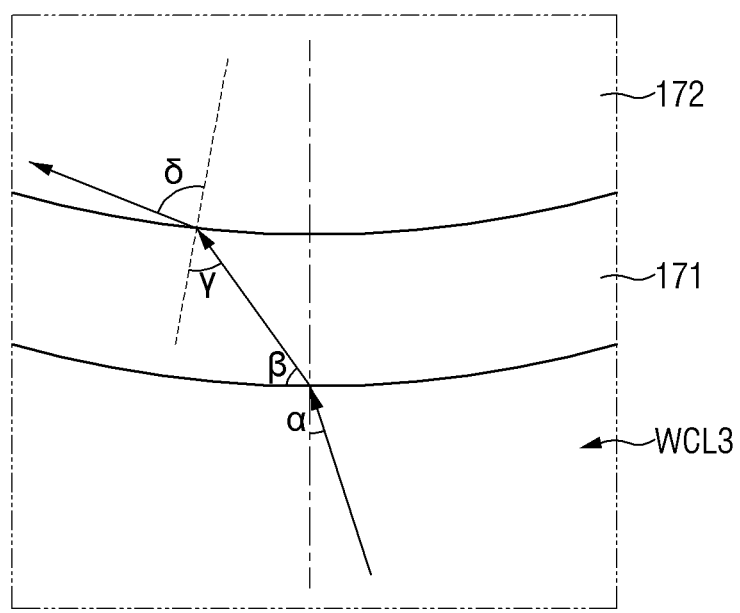
FIG. 5 is an enlarged view of area P of FIG. 4.

FIG. 4 is an enlarged view of area Q of FIG. 2. FIG. 5 is an enlarged view of area P of FIG. 4.

Referring to FIGS. 4 and 5, the first thin-film encapsulation layer 160 may be formed as a single layer of an inorganic film. The thickness t1 of the first thin-film encapsulation layer 160 may be substantially the same for or at each area. The thickness t1 of the first thin-film encapsulation layer 160 may have a value of about 0.8 μm to about 1.5 μm, but is not limited thereto, and may have various suitable values depending on the material included in the first thin-film encapsulation layer 160. For example, the thickness t1 of the first thin-film encapsulation layer 160 may have a smaller value because the first thin-film encapsulation layer 160 includes a material having an excellent encapsulation effect for a thin film. In other words, the thickness t1 of the first thin-film encapsulation layer 160 may suitably vary depending on the material of the first thin-film encapsulation layer 160.

In the display device 1, light may be emitted from the light-emitting element layer 150. For example, the light-emitting layer 152 of the light-emitting element layer 150 may emit light. As described above, the light emitted from the light-emitting layer 152 may be emitted to the outside via the wavelength conversion layer WCL. In the present specification, optical efficiency of the display device 1 may refer to a ratio of light entering the wavelength conversion layer WCL from among the light emitted from the light-emitting layer 152.

As a gap between the upper surface of the light-emitting element layer 150 and a lower surface of the wavelength conversion layer WCL increases, the amount of light entering the wavelength conversion layer WCL from among light emitted from the light-emitting element layer 150 may be reduced, thereby reducing the optical efficiency. On the contrary, as the gap between the upper surface of the light-emitting element layer 150 and the lower surface of the wavelength conversion layer WCL decreases, the amount of light entering the wavelength conversion layer WCL from among the light emitted from the light-emitting element layer 150 may be increased, thereby increasing the optical efficiency.

For example, the light emitted from the light-emitting element layer 150 may be emitted in all directions. Among the light emitted from the light-emitting element layer 150, the light within a wavelength conversion angle θ with respect to a direction perpendicular to the base substrate 101 may enter the wavelength conversion layer WCL. As the gap between the upper surface of the light-emitting element layer 150 and the lower surface of the wavelength conversion layer WCL overlapping the light-emitting element layer 150 increases, the wavelength conversion angle θ, which is an angle range of the light entering the wavelength conversion layer WCL, may be reduced. As the gap between the upper surface of the light-emitting element layer 150 and the lower surface of the wavelength conversion layer WCL overlapping the light-emitting element layer 150 decreases, the wavelength conversion angle θ, which is an angle range of the light entering the wavelength conversion layer WCL, may increase.

In the display device 1 according to an embodiment, because the first thin-film encapsulation layer 160 is disposed between the light-emitting element layer 150 and the wavelength conversion layer WCL, the gap between the upper surface of the light-emitting element layer 150 and the lower surface of the wavelength conversion layer WCL overlapping the light-emitting element layer 150 may be determined by the thickness t1 of the first thin-film encapsulation layer 160.

That is, the optical efficiency may be reduced as the thickness t1 of the first thin-film encapsulation layer 160 increases, and the optical efficiency may increase as the thickness t1 of the first thin-film encapsulation layer 160 decreases.

The upper surface of the first thin-film encapsulation layer 160 may be formed with a stepped portion d1 between the inside and outside of the recessed portion OP1. For example, the stepped portion d1 may be formed between the upper surface of the first thin-film encapsulation layer 160 in an area overlapping (e.g., overlapping in a thickness direction of the base substrate 101) the pixel-defining film PDL and the upper surface of the first thin-film encapsulation layer 160 in an area not overlapping (e.g., not overlapping in a thickness direction of the base substrate 101) the pixel-defining film PDL.

As described above, the upper surface of the first thin-film encapsulation layer 160 and the upper surface of the common electrode 153 may be parallel to each other. That is, like the first thin-film encapsulation layer 160, the upper surface of the common electrode 153 may be formed with a stepped portion d2 between the inside and outside of the recessed portion OP1. For example, the stepped portion d2 may be formed between the upper surface of the common electrode 153 in an area overlapping (e.g., overlapping in a thickness direction of the base substrate 101) the pixel-defining film PDL and the upper surface of the common electrode 153 in an area not overlapping (e.g., not overlapping in a thickness direction of the base substrate 101) the pixel-defining film PDL. The stepped portion d2 of the upper surface of the common electrode 153 may have the same value as the stepped portion d1 of the upper surface of the first thin-film encapsulation layer 160, but is not limited thereto, and may have a value greater than or less than the stepped portion d1 of the upper surface of the first thin-film encapsulation layer 160.

As described above, the upper surface of the wavelength conversion layer WCL has a downward concave shape, and the first inorganic layer 171 of the second thin-film encapsulation layer 170 may be disposed on the wavelength conversion layer WCL. The first inorganic layer 171 may have a thickness t2 having substantially the same value for or at each area on the wavelength conversion layer WCL. The first inorganic layer 171 may have a refractive index lower than that of the wavelength conversion layer WCL. Accordingly, the light entering from the wavelength conversion layer WCL may be dispersed by the first inorganic layer 171 acting as a concave lens.

For example, in a case in which light enters the first inorganic layer 171 from the wavelength conversion layer WCL, an incident angle α of the light may be less than a refraction angle β of the light. An incident angle γ of the light, in a case in which light enters the first organic layer 172 from the first inorganic layer 171, may be greater than the refraction angle β of the light, in the case in which the light enters the first inorganic layer 171 from the wavelength conversion layer WCL, due to the shape of the first inorganic layer 171 concave downward.

The relationship between the incident angle γ and a refraction angle δ of the light in the case in which the light enters the first organic layer 172 from the first inorganic layer 171 may be determined by a difference in refractive index between the first inorganic layer 171 and the first organic layer 172.

For example, when the refractive index of the first organic layer 172 is greater than that of the first inorganic layer 171, the refraction angle δ may be less than the incident angle γ in the case in which the light enters the first organic layer 172 from the first inorganic layer 171. On the contrary, when the refractive index of the first organic layer 172 is less than that of the first inorganic layer 171, the refraction angle δ may be greater than the incident angle γ in the case in which the light enters the first organic layer 172 from the first inorganic layer 171.

In the display device 1 according to an embodiment, the first inorganic layer 171 disposed on the upper surface of the wavelength conversion layer WCL and having a downward concave shape may provide the same effect as a concave lens to the light emitted from the wavelength conversion layer WCL. That is, the light emitted from the wavelength conversion layer WCL may be dispersed and emitted. Accordingly, the light emitted from the display device 1 may be viewed from various angles. In other words, a viewing angle of the display device 1 may be increased.

In addition, the display device 1 according to an embodiment may improve the optical efficiency of the light entering the wavelength conversion layer WCL from the light-emitting element layer 150 through the first thin-film encapsulation layer 160 disposed between the light-emitting element layer 150 and the wavelength conversion layer WCL and made of an inorganic material.

Figure 6:
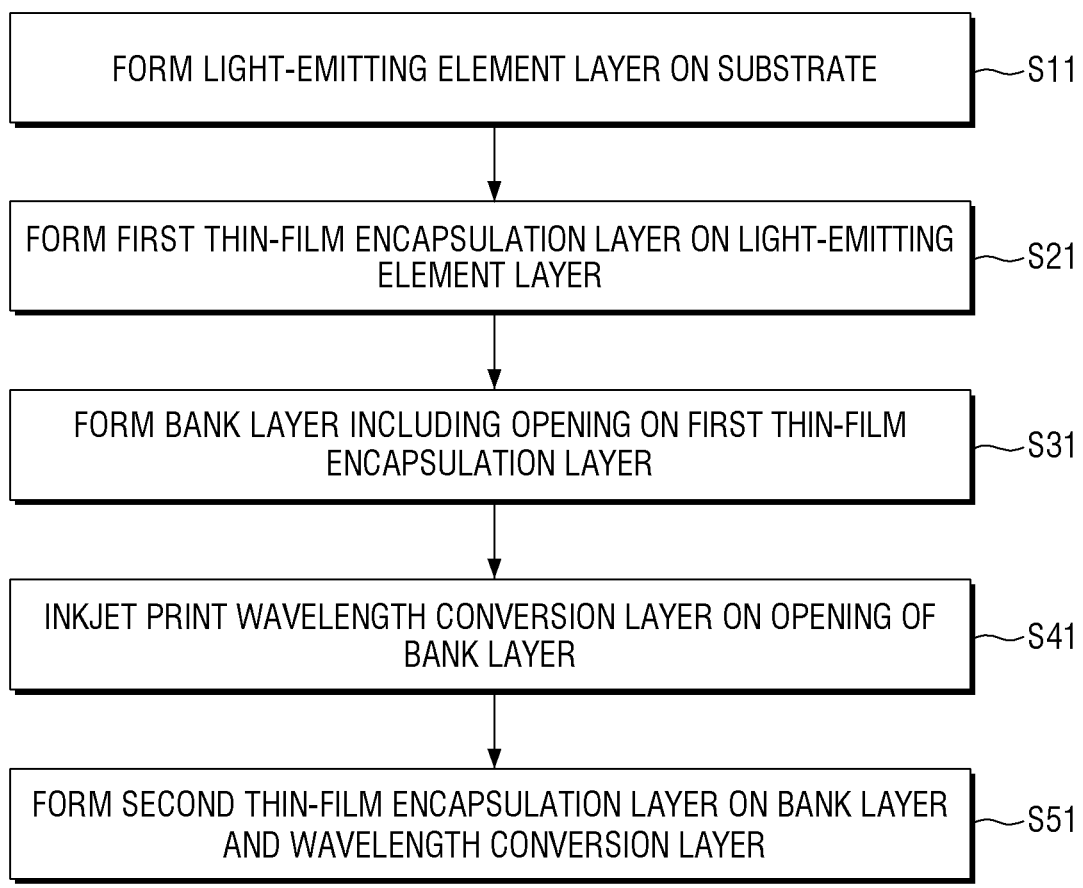
FIG. 6 is a flowchart illustrating a method of manufacturing a display device according to an embodiment.

FIG. 6 is a flowchart illustrating a method of manufacturing a display device according to an embodiment. FIGS. 7-12 are schematic views illustrating the method of manufacturing a display device according to an embodiment.

Referring to FIG. 6, the method of manufacturing a display device according to an embodiment may include forming a light-emitting element layer on a substrate (S11), forming a first thin-film encapsulation layer on the light-emitting element layer (S21), forming a bank layer including an opening on the first thin-film encapsulation layer (S31), inkjet printing a wavelength conversion layer on the opening of the bank layer (S41), and forming a second thin-film encapsulation layer on the bank layer and the wavelength conversion layer (S51).

Figure 7:
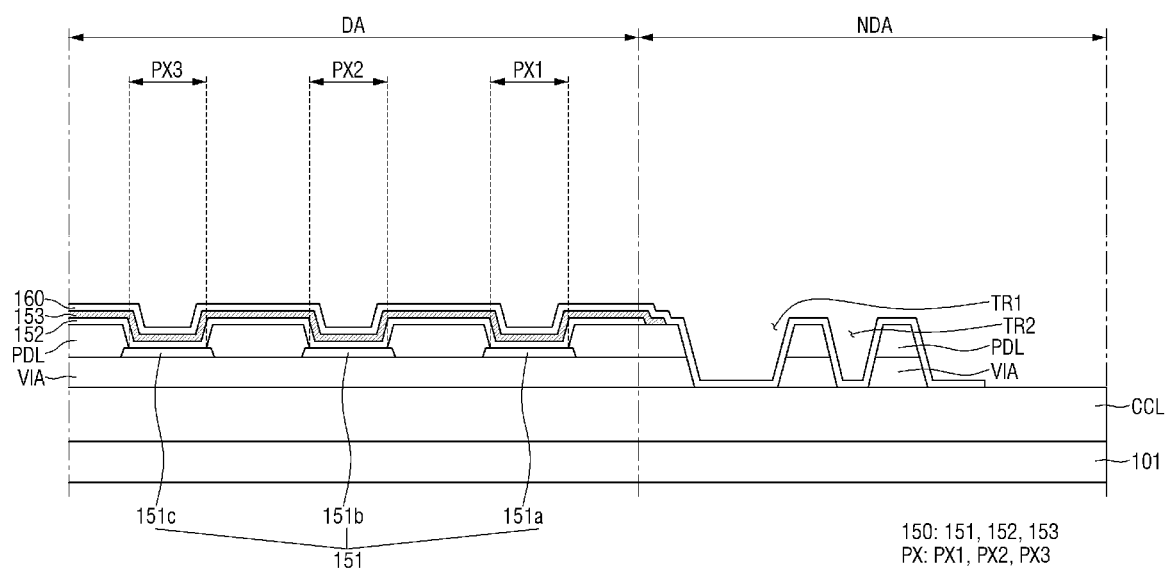
FIGS. 7-12 are schematic views illustrating the method of manufacturing a display device according to an embodiment.

Referring to FIGS. 6 and 7, first, operation S11 of forming the light-emitting element layer on the substrate may be performed. For example, a light-emitting element layer 150 including a pixel electrode 151, a light-emitting layer 152, and a common electrode 153 may be formed on a base substrate 101 on which a circuit layer CCL and a via layer VIA are stacked. Descriptions of the base substrate 101, the circuit layer CCL, and the via layer VIA are the same as those given above with reference to FIGS. 2-5, and thus, redundant descriptions thereof may not be repeated.

Operation S11 of forming the light-emitting element layer on the substrate may include forming the pixel electrode 151 on the via layer VIA. For example, a first pixel electrode 151a may be formed in a first pixel PX1, a second pixel electrode 151b may be formed in a second pixel PX2, and a third pixel electrode 151c may be formed in a third pixel PX3. The first to third pixel electrodes (the first pixel electrode 151a, the second pixel electrode 151b, and the third pixel electrode 151c) may be disposed to be spaced from each other.

Operation S11 of forming the light-emitting element layer on the substrate may further include forming a pixel-defining film PDL on the pixel electrode 151 along a boundary of each pixel PX. The pixel-defining film PDL may expose (e.g., partially expose) each of the first to third pixel electrodes 151a, 151b, and 151c.

Operation S11 of forming the light-emitting element layer on the substrate may further include forming (e.g., sequentially forming) the light-emitting layer 152 and the common electrode 153 on the pixel electrode 151 and the pixel-defining film PDL. In a display area DA, the light-emitting layer 152 and the common electrode 153 may be disposed entirely without distinguishing the pixels PX. However, in a non-display area NDA, the light-emitting layer 152 and the common electrode 153 may be disposed (e.g., partially disposed). For example, in the non-display area NDA, an edge of each of the light-emitting layer 152 and the common electrode 153 may be disposed further inward (e.g., inward relative to a center of the display device 1) than a first trench TR1.

After operation S11 of forming the light-emitting element layer on the substrate, operation S21 of forming the first thin-film encapsulation layer on the light-emitting element layer may be performed.

A first thin-film encapsulation layer 160 may be disposed on the light-emitting element layer 150. For example, in the display area DA, the first thin-film encapsulation layer 160 may be disposed on the common electrode 153 (e.g., the entirety of the common electrode 153) without distinguishing the pixels PX. In an embodiment, the first thin-film encapsulation layer 160 may overlap the pixels PX in a thickness direction of the base substrate 101. In the non-display area NDA, the first thin-film encapsulation layer 160 may be disposed on the common electrode 153 (e.g., the entirety of the common electrode 153), the pixel-defining film PDL, and the via layer VIA. The first thin-film encapsulation layer 160 may be in contact (e.g., direct contact) with the circuit layer CCL below the via layer VIA through the first trench TR1 passing through the pixel-defining film PDL and the via layer VIA.

An upper surface of the first thin-film encapsulation layer 160 may be parallel to an upper surface of the light-emitting element layer 150. That is, the upper surface of the first thin-film encapsulation layer 160 may be parallel to an upper surface of the common electrode 153. In other words, the upper surface of the first thin-film encapsulation layer 160 may conform to the upper surface of the light-emitting element layer 150, and may conform to the upper surface of the common electrode 153.

Figure 8:
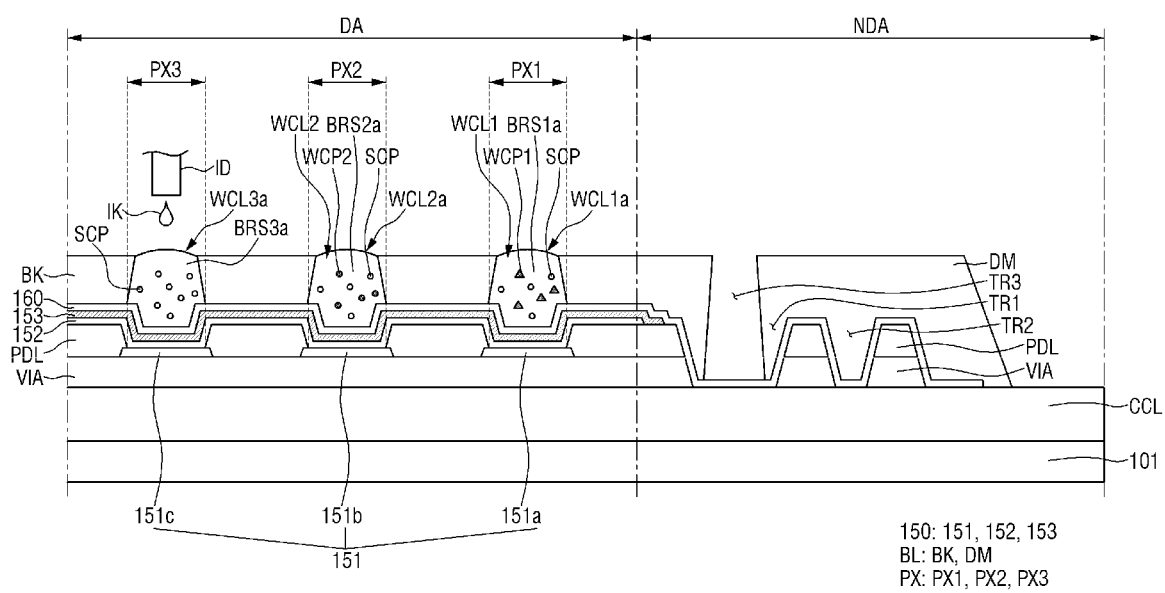
Figure 9:
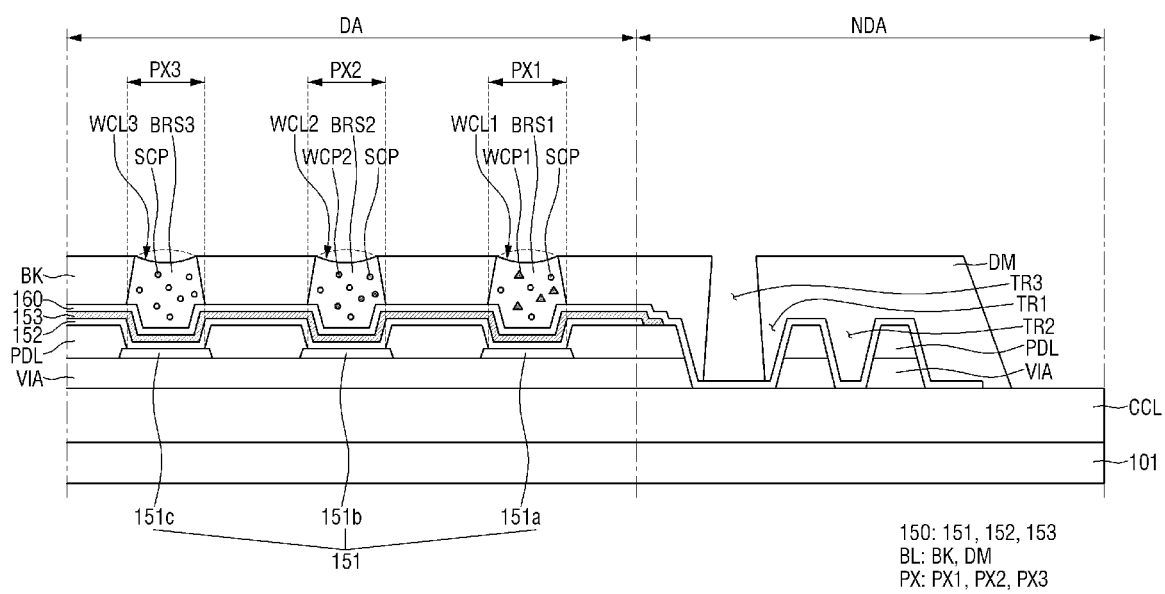
Figure 10:
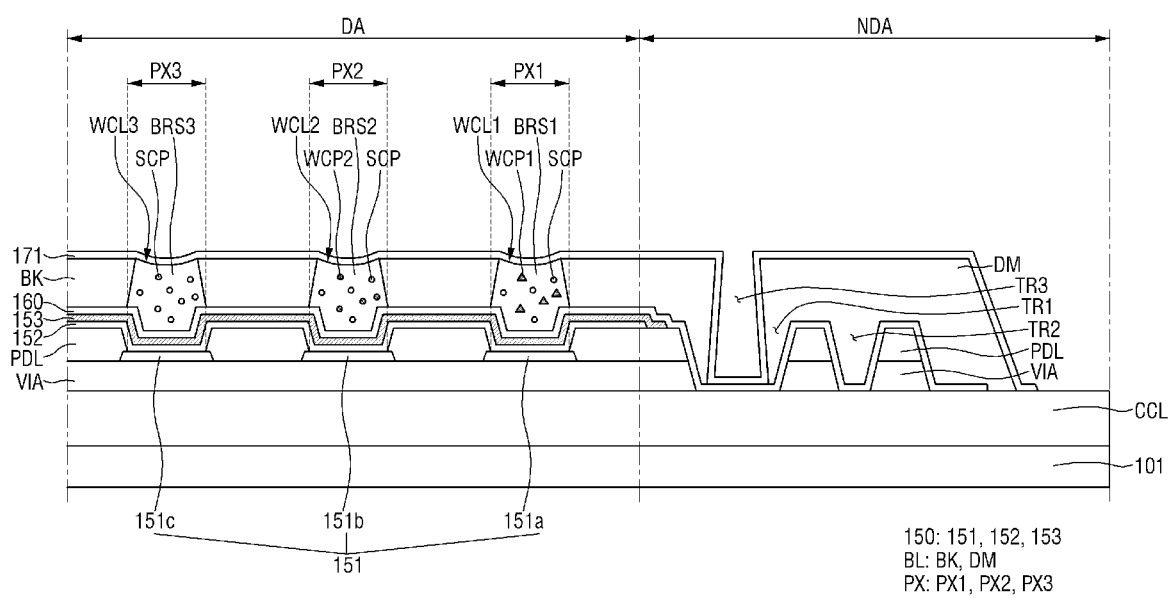
Figure 11:
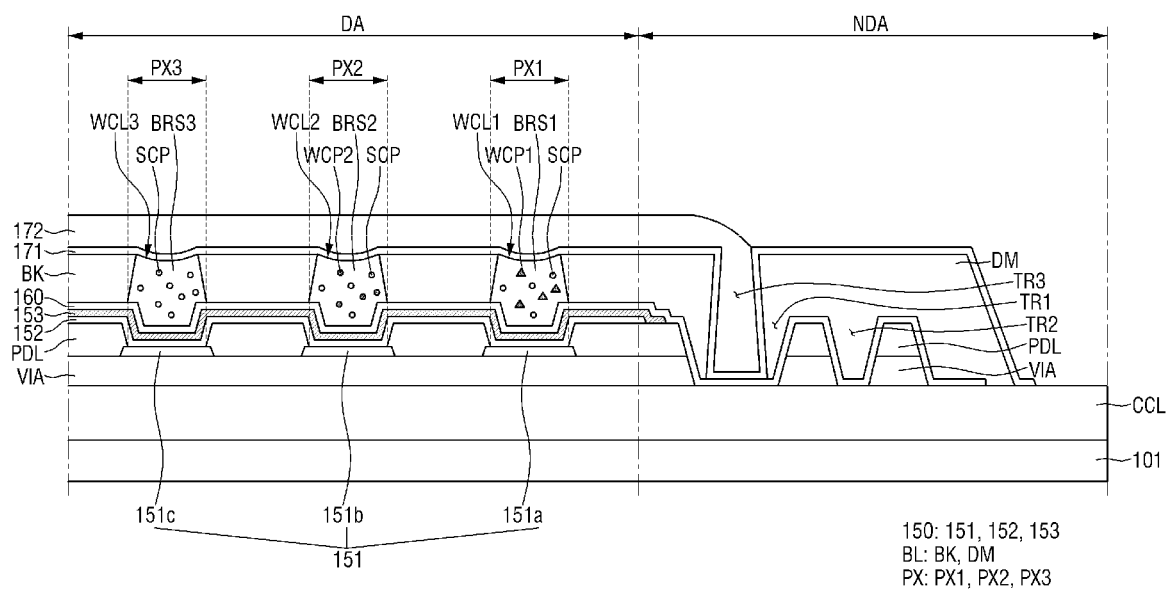
Figure 12:
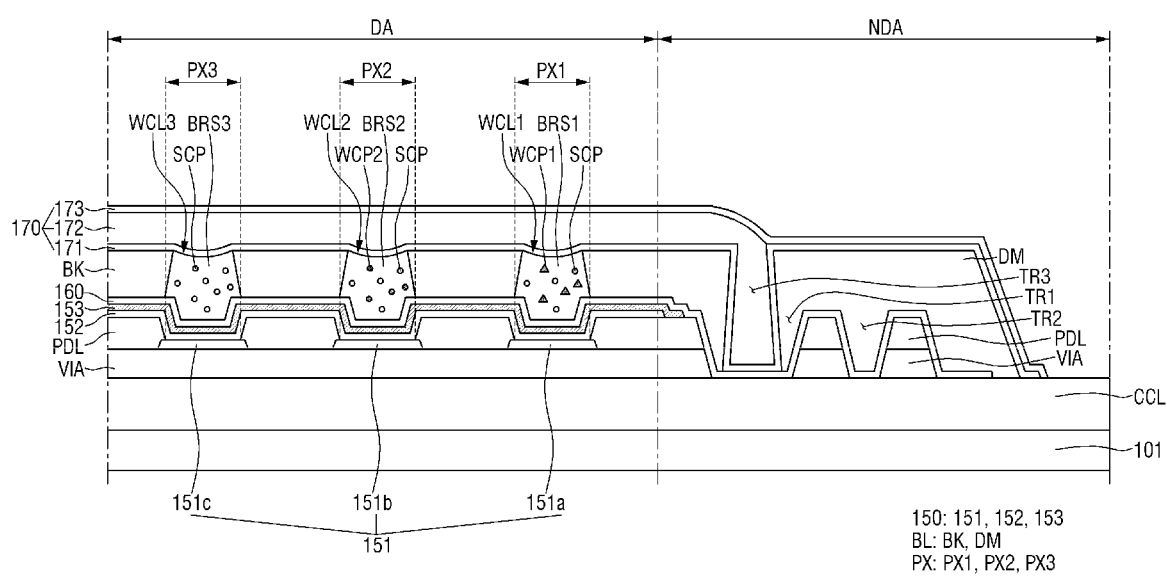

Referring to FIGS. 6, 8, and 9, after operation S21 of forming the first thin-film encapsulation layer on the light-emitting element layer, operation S31 of forming the bank layer including the opening on the first thin-film encapsulation layer may be performed. The bank layer BL may include a partition wall BK and a dam DM disposed outside the partition wall BK.

The partition wall BK including an opening OP2 may be disposed in the display area DA. The opening OP2 may expose a recessed portion OP1 and may be spatially connected to the recessed portion OP1. The opening OP2 may expose (e.g., partially expose) the first thin-film encapsulation layer 160. As described above with reference to FIG. 2, the partition wall BK may have a reverse-tapered structure in which a cross-sectional area of the partition wall BK decreases from an upper side to a lower side. Meanwhile, a width of the opening OP2 may increase from an upper side to a lower side.

The partition wall BK having a reverse-tapered structure may be formed through various suitable methods. For example, a negative photoresist material may be used to form the partition wall BK having a reverse-tapered structure. However, the present disclosure is not limited thereto.

In an embodiment, a material for forming the bank layer BL may be applied on the first thin-film encapsulation layer 160, and then a negative photoresist material is applied thereon so as to cover the entirety thereof to form a photoresist layer, and a portion of the partition wall BK having a reverse-tapered structure is exposed in the final structure. Thereafter, an unexposed portion of the negative photoresist may be removed in a developing process, and thus a partial area of the first thin-film encapsulation layer 160 overlapping the pixel electrode 151 may be exposed. At this point, a lower portion of the photoresist layer is removed relatively more than an upper portion of the photoresist layer in the developing process because relatively more light is irradiated on the upper portion of the photoresist layer than the lower portion of the photoresist layer in an exposure process, thereby forming the partition wall BK having a reverse-tapered structure.

In the non-display area NDA, a portion of the partition wall BK and the dam DM disposed outside the partition wall BK may be formed. A third trench TR3 exposing (e.g., partially exposing) the first thin-film encapsulation layer 160 may be formed between the partition wall BK and the dam DM. The partition wall BK and the dam DM of the non-display area NDA may also have a reverse-tapered structure like the display area DA. The partition wall BK and the dam DM may be formed in the non-display area NDA in the same manner as the formation of the partition wall BK in the display area DA described above. The formation of the partition wall BK in the display area DA and the formation of the partition wall BK and the dam DM in the non-display area NDA may be concurrently (e.g., simultaneously) performed.

After operation S31 of forming the bank layer including the opening on the first thin-film encapsulation layer, operation S41 of inkjet printing the wavelength conversion layer on the opening of the bank layer may be performed.

Operation S41 of inkjet printing the wavelength conversion layer on the opening of the bank layer may include forming wavelength conversion materials WCL1a, WCL2a, and WCL3a by inkjet printing an ink IK for forming a wavelength conversion layer WCL on the recessed portion OP1 and the opening OP2 using an inkjet printing device ID, and curing the wavelength conversion materials WCL1a, WCL2a, and WCL3a.

The wavelength conversion materials WCL1a, WCL2a, and WCL3a may be formed through an inkjet printing process. The ink IK is inkjet-printed on the recessed portion OP1 and the opening OP2, and may not be applied to the third trench TR3. The wavelength conversion materials WCL1a, WCL2a, and WCL3a may include a first wavelength conversion material WCL1a disposed on the first pixel PX1, a second wavelength conversion material WCL2a disposed on the second pixel PX2, and a third wavelength conversion material WCL3a disposed on the third pixel PX3.

An upper surface of each of the wavelength conversion materials WCL1a, WCL2a, and WCL3a formed through the inkjet printing process may have an upward convex shape. As shown in FIG. 9, each of the wavelength conversion materials WCL1a, WCL2a, and WCL3a may change to the wavelength conversion layer WCL having an upper surface that is concave downward as shown in FIG. 9. A lower surface of the wavelength conversion layer WCL may include a stepped portion. In addition, the lower surface of the wavelength conversion layer WCL may be parallel to the upper surface of the first thin-film encapsulation layer 160. In other words, the lower surface of the wavelength conversion layer WCL may conform to the upper surface of the first thin-film encapsulation layer 160.

Referring to FIGS. 6 and 10-12, after operation S41 of inkjet printing the wavelength conversion layer on the opening of the bank layer, operation S51 of forming the second thin-film encapsulation layer on the bank layer and the wavelength conversion layer may be performed.

Operation S51 of forming the second thin-film encapsulation layer on the bank layer and the wavelength conversion layer may include forming a first inorganic layer 171 on the bank layer BL and the wavelength conversion layer WCL, forming a first organic layer 172 on the first inorganic layer 171, and forming a second inorganic layer 173 on the first organic layer 172.

The first inorganic layer 171 may be formed on the bank layer BL and the wavelength conversion layer WCL without distinguishing the pixels PX. In an embodiment, the bank layer BL may overlap the pixels PX in a thickness direction of the base substrate 101. The first inorganic layer 171 may have a uniform or substantially uniform thickness for or at each area, but is not limited thereto, and may have various suitable thicknesses according to a stepped portion therebelow.

The first organic layer 172 may be formed on the first inorganic layer 171. The first organic layer 172 may be formed in a manner of applying an organic material and then curing the organic material. The organic material for forming the first organic layer 172 may cover (e.g., entirely cover) the first inorganic layer 171 in the display area DA, and may be filled in the third trench TR3 in the non-display area NDA. At this point, the organic material for forming the first organic layer 172 may be filled in the third trench TR3, and may not overflow to the outside of the third trench TR3.

The first organic layer 172 formed as described above may include a flat upper surface in the display area DA and may include an upper surface curved downward in the non-display area NDA. For example, the first organic layer 172 may have the upper surface whose height decreases toward the outside in an area overlapping the third trench TR3.

The second inorganic layer 173 may be disposed on the first organic layer 172. The second inorganic layer 173 may be formed to cover the first organic layer 172 (e.g., the entirety of the first organic layer 172). The second inorganic layer 173 may be in contact with the first inorganic layer 171 in the non-display area NDA. Thus, the first organic layer 172 may be encapsulated by the first inorganic layer 171 and the second inorganic layer 173.

In the method of manufacturing a display device according to an embodiment, the first thin-film encapsulation layer 160, which is a single layer made of an inorganic film, may be disposed between the light-emitting element layer 150 and the wavelength conversion layer WCL, thereby manufacturing a display device 1 with improved optical efficiency.

Hereinafter, other embodiments of the display device 1 will be described. In descriptions of the display device 1 according to other embodiments to be described below, a redundant description with that of the display device 1 according to an embodiment may not be repeated, and a description primarily describing differences is given.

Figure 13:
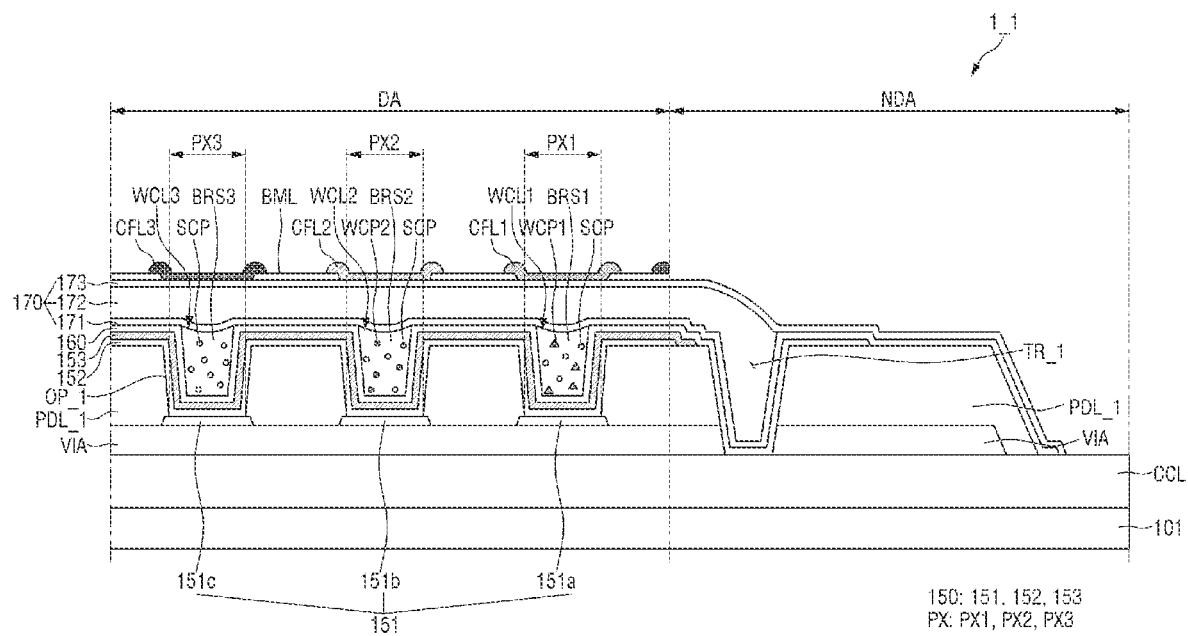
FIG. 13 is a cross-sectional view of a display device according to another embodiment.

FIG. 13 is a cross-sectional view of a display device according to another embodiment.

Referring to FIG. 13, a display device 1_1 according to the present embodiment is different from the display device 1 according to an embodiment in that a bank layer BL is omitted and a wavelength conversion layer WCL is disposed inside an opening OP_1 included in a pixel-defining film PDL_1.

The display device 1_1 according to the present embodiment may include a base substrate 101, a circuit layer CCL disposed on the base substrate 101, a via layer VIA disposed on the circuit layer CCL, a pixel electrode 151 disposed on the via layer VIA, the pixel-defining film PDL_1 disposed on the pixel electrode 151, a light-emitting layer 152 disposed on the pixel-defining film PDL_1, a common electrode 153 disposed on the light-emitting layer 152, a first thin-film encapsulation layer 160 disposed on the common electrode 153, the wavelength conversion layer WCL disposed on the first thin-film encapsulation layer 160 at the inside of the opening OP_1 of the pixel-defining film PDL_1, and a second thin-film encapsulation layer 170 disposed on the first thin-film encapsulation layer 160 and the wavelength conversion layer WCL.

In the present embodiment, the pixel-defining film PDL_1 may include the opening OP_1 disposed in the display area DA along a boundary of a pixel PX, and a trench TR_1 disposed in the non-display area NDA.

The pixel-defining film PDL_1 may have a structure in which a cross-sectional area of the pixel-defining film PDL_1 increases from an upper side to a lower side. On the other hand, each of the opening OP_1 and the trench TR_1 may have a structure in which a width thereof decreases from an upper side to a lower side.

The opening OP_1 may overlap the pixel electrode 151. The light-emitting layer 152 may be in contact with the pixel electrode 151 through the opening OP_1.

In the present embodiment, the pixel-defining film PDL_1 may function as a bank when the wavelength conversion layer WCL is formed. The wavelength conversion layer WCL may be disposed inside the opening OP_1 and may be disposed on the first thin-film encapsulation layer 160. That is, the wavelength conversion layer WCL may not be in contact (e.g., direct contact) with the pixel-defining film PDL_1. An upper surface of the wavelength conversion layer WCL may have a downward concave shape.

The second thin-film encapsulation layer 170 may include a first inorganic layer 171 disposed on the first thin-film encapsulation layer 160 and the wavelength conversion layer WCL, a first organic layer 172 disposed on the first inorganic layer 171, and a second inorganic layer 173 disposed on the first organic layer 172.

In an area at which the first inorganic layer 171 does not overlap the wavelength conversion layer WCL, the first inorganic layer 171 and the first thin-film encapsulation layer 160 may be in contact with each other. A lower surface of the first inorganic layer 171 may have a downward convex shape in an area overlapping the wavelength conversion layer WCL.

In the non-display area NDA, the first thin-film encapsulation layer 160 may be in contact with the circuit layer CCL through the trench TR_1 passing through the pixel-defining film PDL_1 and the via layer VIA. The first organic layer 172 may be filled in the trench TR_1. In the non-display area NDA of the display device 1_1 according to the present embodiment, the via layer VIA and the pixel-defining film PDL_1 may perform the same function as the dam DM of the display device 1 according to an embodiment. That is, in the non-display area NDA, the via layer VIA and the pixel-defining film PDL_1 may prevent or substantially prevent an organic material for forming the first organic layer 172 from overflowing to the outside when the first organic layer 172 is formed. The first inorganic layer 171 and the second inorganic layer 173 may be in contact with each other outside the trench TR_1. For example, the first inorganic layer 171 and the second inorganic layer 173 may be in contact with each other adjacent to or at a side of the trench TR_1.

The display device 1_1 according to the present embodiment may improve the optical efficiency of light entering the wavelength conversion layer WCL from the light-emitting element layer 150 through the first thin-film encapsulation layer 160 disposed between the light-emitting element layer 150 and the wavelength conversion layer WCL and made of an inorganic material.

Further, in the display device 1_1 according to the present embodiment, the first inorganic layer 171 disposed on the upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_1 may be viewed from various angles. In other words, a viewing angle of the display device 1_1 may be increased.

In addition, the display device 1_1 according to the present embodiment may function as a bank when the pixel-defining film PDL_1 distinguishing the pixels PX is formed in the wavelength conversion layer WCL. Accordingly, even when a separate bank is not formed, because the wavelength conversion layer WCL may be formed, the process efficiency of a manufacturing process of the display device 1_1 may be improved. In an embodiment, the pixel-defining film PDL_1 may define the pixels PX (e.g., separate the pixels PX from each other).

Figure 14:
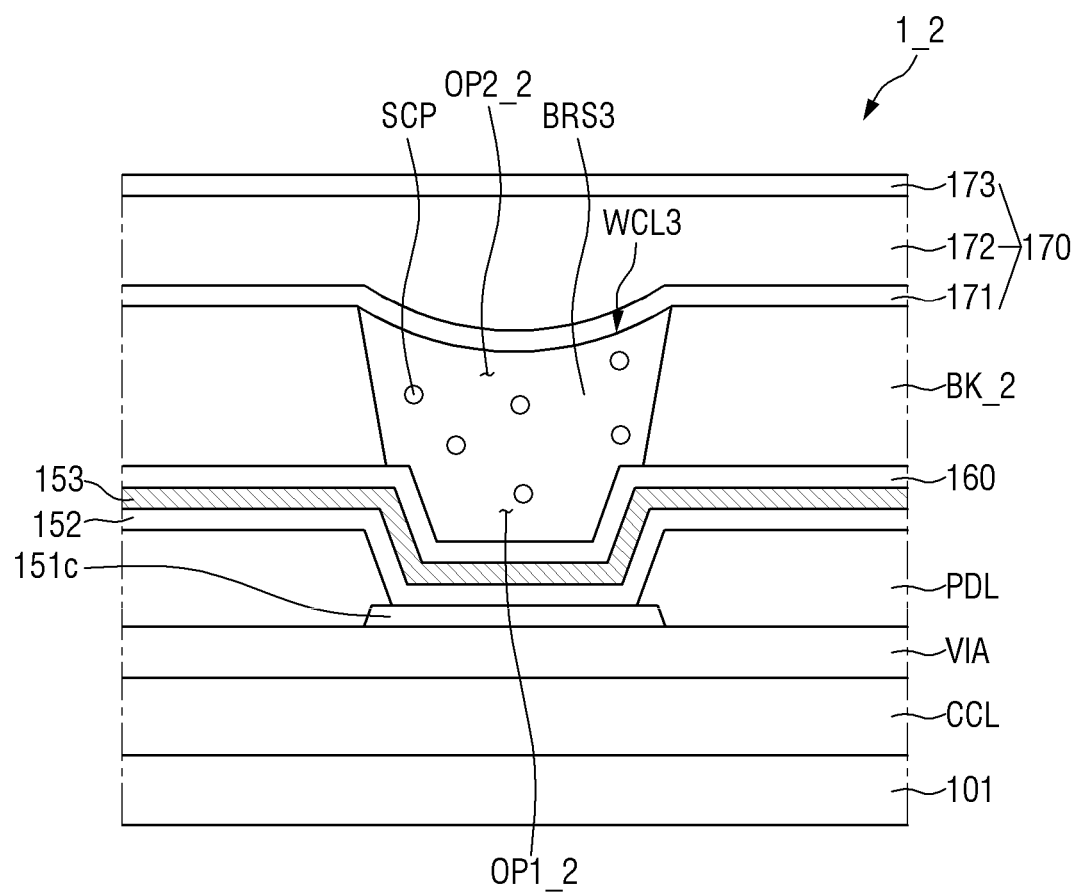
FIG. 14 is a cross-sectional view of a pixel of a display device according to still another embodiment.

FIG. 14 is a cross-sectional view of a pixel of a display device according to still another embodiment.

Referring to FIG. 14, a display device 1_2 according to the present embodiment is different from the display device 1 according to an embodiment in that the display device 1_2 includes a bank layer including a partition wall BK_2 having a structure in which a cross-sectional area of the partition wall BK_2 increases from an upper side to a lower side.

In the present embodiment, the partition wall BK_2 may be disposed on a pixel-defining film PDL. For example, an edge of the partition wall BK_2 may also be disposed on the pixel-defining film PDL.

In the display device 1_2 according to the present embodiment, the bank layer may include an opening OP2_2 whose width increases from a lower side to an upper side. The opening OP2_2 may overlap a recessed portion OP1_2 included in the pixel-defining film PDL. The width of the opening OP2_2 may be greater than a width of the recessed portion OP1_2. Light emitted from a light-emitting element layer 150 may be emitted at a wider angle through the opening OP2_2 whose width increases from a lower side to an upper side. Accordingly, the light emitted from the display device 1_2 according to the present embodiment may be viewed from various angles. That is, a viewing angle of the display device 1_2 may be increased.

The display device 1_2 according to the present embodiment may improve the optical efficiency of light entering a wavelength conversion layer WCL from the light-emitting element layer 150 through a first thin-film encapsulation layer 160 disposed between the light-emitting element layer 150 and the wavelength conversion layer WCL and made of an inorganic material.

Further, in the display device 1_2 according to the present embodiment, the first inorganic layer 171 disposed on the upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_2 may be viewed from various angles. That is, the viewing angle of the display device 1_2 may be increased.

In addition, the display device 1_2 according to the present embodiment includes the opening OP2_2 whose width increases as from a lower side to an upper side so that the light emitted from the light-emitting element layer 150 may be emitted at a wider angle. Accordingly, the light emitted from the display device 1_2 according to the present embodiment may be viewed from more various angles. In other words, the viewing angle of the display device 1_2 may be further increased.

Figure 15:
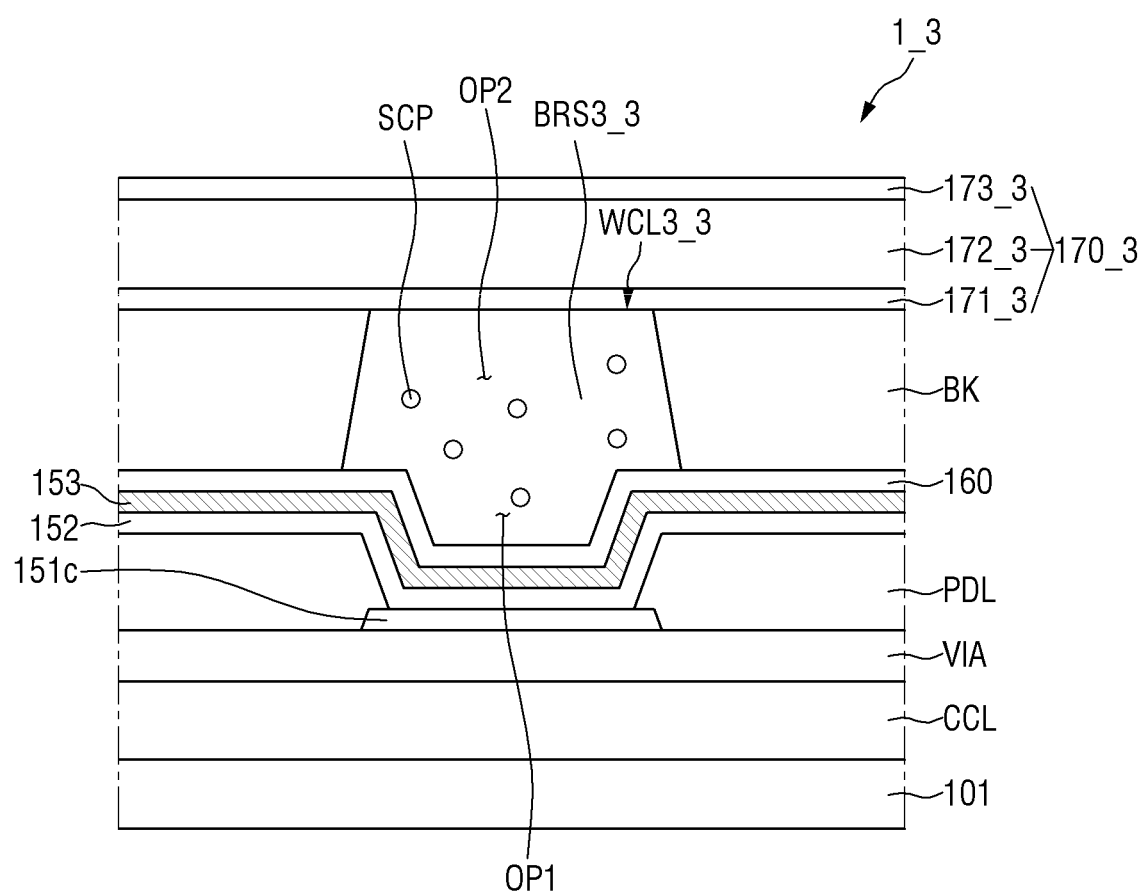
FIG. 15 is a cross-sectional view of a pixel of a display device according to yet another embodiment.

FIG. 15 is a cross-sectional view of a pixel of a display device according to yet another embodiment.

Referring to FIG. 15, a display device 1_3 according to the present embodiment is different from the display device 1 according to an embodiment in that the display device 1_3 includes a wavelength conversion layer WCL having a different shape. The shape of the wavelength conversion layer WCL may be variously formed in a suitable manner according to the amount of solvent included in the ink IK (e.g., see FIG. 8) for forming the corresponding wavelength conversion layer WCL.

Hereinafter, a description will be made based on a third wavelength conversion pattern WCL3_3 of the wavelength conversion layer WCL with reference to FIG. 15, and first and second wavelength conversion patterns may also have the same shape.

The third wavelength conversion pattern WCL3_3 included in the display device 1_3 according to the present embodiment may include a base resin BRS3_3 and a flat upper surface. An ink IK for forming the third wavelength conversion pattern WCL3_3 according to the present embodiment may include a larger amount of solvent than the ink IK for forming the third wavelength conversion pattern WCL3 (e.g., the third wavelength conversion pattern WCL3 in FIG. 2) included in the display device 1 according to an embodiment. Because the third wavelength conversion pattern WCL3_3 included in the display device 1_3 according to the present embodiment is manufactured using the ink IK including a relatively large amount of solvent, a large amount of solvent may be volatilized during a curing process to form the flat upper surface.

Accordingly, a shape of a second thin-film encapsulation layer 170_3 included in the display device 1_3 according to the present embodiment may also be changed. In the present embodiment, a first inorganic layer 171_3, a first organic layer 172_3, and a second inorganic layer 173_3 included in the second thin-film encapsulation layer 170_3 may each include flat upper and lower surfaces.

The display device 1_3 according to the present embodiment may improve the optical efficiency of light entering the wavelength conversion layer WCL from a light-emitting element layer 150 through a first thin-film encapsulation layer 160 disposed between the light-emitting element layer 150 and the wavelength conversion layer WCL and made of an inorganic material.

In addition, the wavelength conversion layer WCL included in the display device 1_3 according to the present embodiment may include a flat upper surface, and the second thin-film encapsulation layer 170_3 disposed on the wavelength conversion layer WCL may also include flat upper and lower surfaces, thereby not affecting an optical path of light emitted from the wavelength conversion layer WCL. Accordingly, the display device 1_3 according to the present embodiment may emit light in the same direction for each pixel PX.

Figure 16:
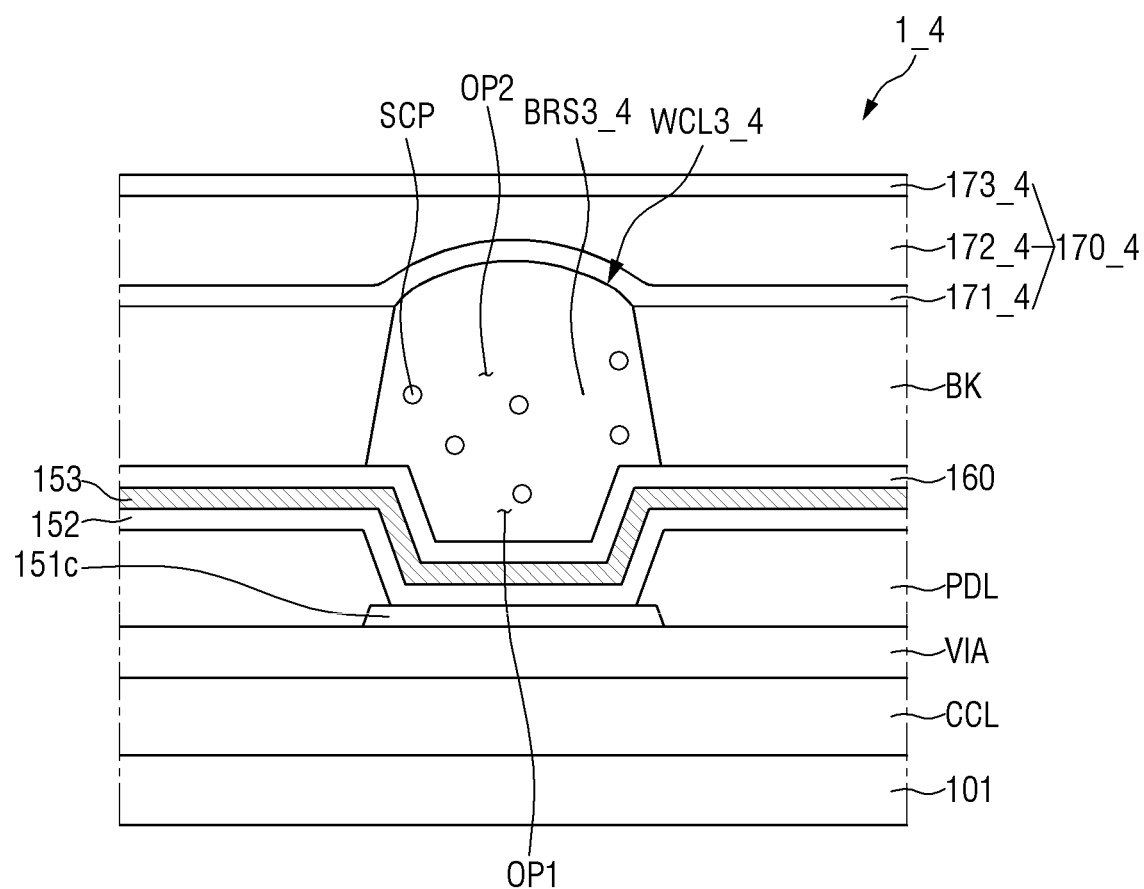
FIG. 16 is a cross-sectional view of a pixel of a display device according to yet another embodiment.

FIG. 16 is a cross-sectional view of a pixel of a display device according to yet another embodiment.

Referring to FIG. 16, a display device 1_4 according to the present embodiment is different from the display device 1 according to an embodiment in that the display device 1_4 includes a wavelength conversion layer WCL having a different shape. The shape of the wavelength conversion layer WCL may be variously formed in a suitable manner according to the amount of solvent included in the ink IK (e.g., see FIG. 8) for forming the corresponding wavelength conversion layer WCL.

Hereinafter, a description will be made based on a third wavelength conversion pattern WCL3_4 of the wavelength conversion layer WCL with reference to FIG. 16, and first and second wavelength conversion patterns may also have the same shape.

The third wavelength conversion pattern WCL3_4 included in the display device 1_4 according to the present embodiment may include a base resin BRS3_4 and an upper surface that is convex upward. An ink IK for forming the third wavelength conversion pattern WCL3_4 according to the present embodiment may include a smaller amount of solvent than the ink IK for forming the third wavelength conversion pattern WCL3 (e.g., the third wavelength conversion pattern WCL3 in FIG. 2) included in the display device 1 according to an embodiment. Because the third wavelength conversion pattern WCL3_4 included in the display device 1_4 according to the present embodiment is manufactured using the ink IK including a relatively small amount of solvent, a small amount of solvent may be volatilized during a curing process to form the upper surface that is convex upward.

Accordingly, a shape of a second thin-film encapsulation layer 170_4 included in the display device 1_4 according to the present embodiment may also be changed. In the present embodiment, a first inorganic layer 171_4 included in the second thin-film encapsulation layer 170_4 may conform to an upper surface of the third wavelength conversion pattern WCL3_4 in an area overlapping the third wavelength conversion pattern WCL3_4. That is, the first inorganic layer 171_4 may have an upward convex shape in correspondence with a shape of the upper surface of the third wavelength conversion pattern WCL3_4 overlapping the first inorganic layer 171_4. In other words, the upper surface of the third wavelength conversion pattern WCL3_4 may increase in height from an edge to a central portion at an upper surface. The second thin-film encapsulation layer 170_4 may include the first inorganic layer 171_4, a first organic layer 172_4, and a second inorganic 173_4.

The display device 1_4 according to the present embodiment may improve the optical efficiency of light entering the wavelength conversion layer WCL from a light-emitting element layer 150 through a first thin-film encapsulation layer 160 disposed between the light-emitting element layer 150 and the wavelength conversion layer WCL and made of an inorganic material.

Further, in the display device 1_4 according to the present embodiment, the first inorganic layer 171_4 disposed on an upper surface of the wavelength conversion layer WCL and having an upward convex shape may provide the same effect as a convex lens to light emitted from the wavelength conversion layer WCL. That is, the light emitted from the wavelength conversion layer WCL may be focused and emitted. Accordingly, light emitted from the display device 1_4 may be focused, so that a large amount of light may be viewed from a specific position. That is, the brightness of the display device 1_4 may be increased.

Figure 17:
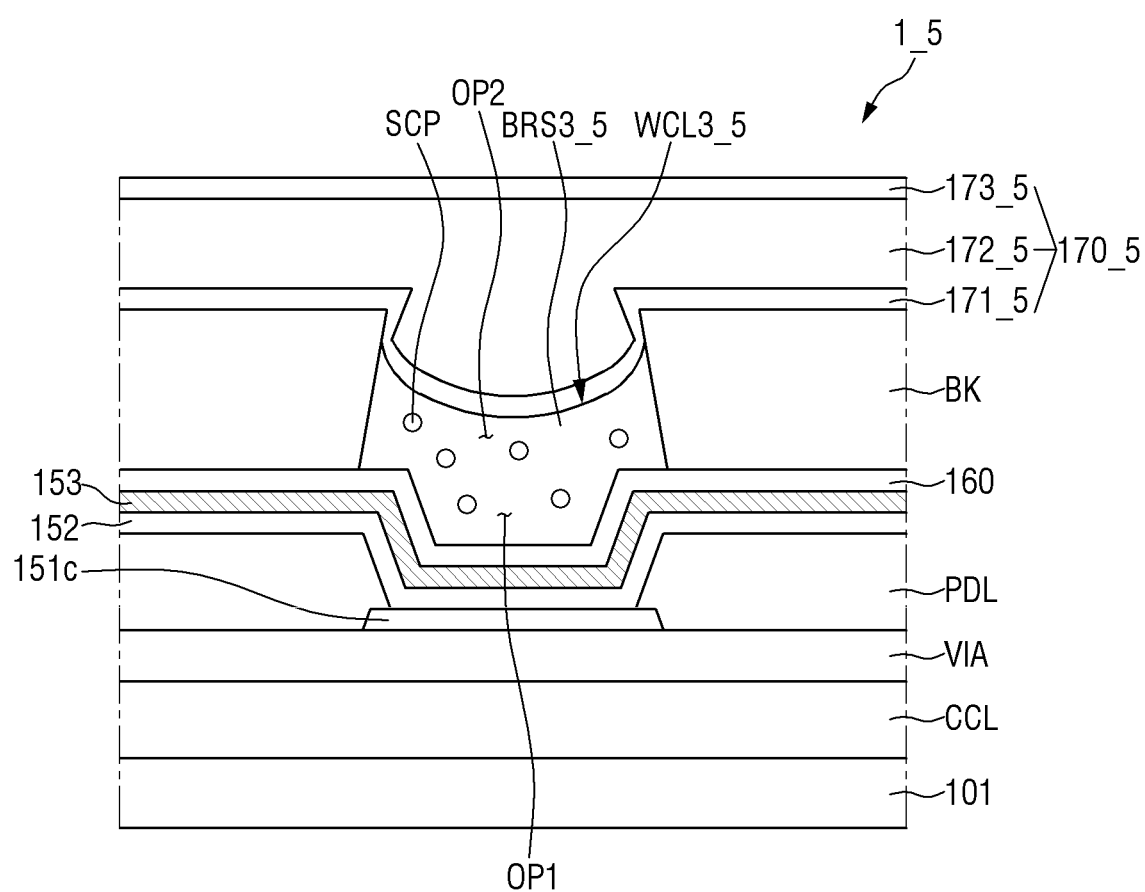
FIG. 17 is a cross-sectional view of a pixel of a display device according to yet another embodiment.

FIG. 17 is a cross-sectional view of a pixel of a display device according to yet another embodiment.

Referring to FIG. 17, a display device 1_5 according to the present embodiment is different from the display device 1 according to an embodiment in that the display device 1_5 includes a wavelength conversion layer WCL having a different shape. The shape of the wavelength conversion layer WCL may be variously formed in a suitable manner according to the amount of solvent included in the ink IK (e.g., see FIG. 8) for forming the corresponding wavelength conversion layer WCL.

Hereinafter, a description will be made based on a third wavelength conversion pattern WCL3_5 of the wavelength conversion layer WCL with reference to FIG. 17, and first and second wavelength conversion patterns may also have the same shape.

The third wavelength conversion pattern WCL3_5 included in the display device 1_5 according to the present embodiment is in contact with a side surface of a partition wall BK forming an opening OP2, and may includea a base resin BRS3_5 and an upper surface having a downward concave shape. The third wavelength conversion pattern WCL3_5 may have a structure recessed into the opening OP2. A height of an edge of the third wavelength conversion pattern WCL3_5 may be less than a height of the partition wall BK in contact therewith. In an embodiment, an upper surface of the third wavelength conversion pattern WCL3_5 is closer to the base substrate 101 than an upper surface of the partition wall BK adjacent to the third wavelength conversion pattern WCL3_5 is to the base substrate 101.

An ink IK for forming the third wavelength conversion pattern WCL3_5 according to the present embodiment may include a larger amount of solvent than the ink IK for forming the third wavelength conversion pattern WCL3 (e.g., the third wavelength conversion pattern WCL3 in FIG. 2) included in the display device 1 according to an embodiment. Because the third wavelength conversion pattern WCL3_5 included in the display device 1_5 according to the present embodiment is manufactured using the ink IK including a relatively large amount of solvent, a large amount of solvent may be volatilized during a curing process to form the upper surface that is concave downward.

Accordingly, a shape of a second thin-film encapsulation layer 170_5 included in the display device 1_5 according to the present embodiment may also be changed. In the present embodiment, a first inorganic layer 171_5 included in the second thin-film encapsulation layer 170_5 may be in contact with the partition wall BK and the third wavelength conversion pattern WCL3_5. The second thin-film encapsulation ayer 170_5 may include the first inorganic layer 171_5, an organic layer 172_5, and a second inorganic layer 173_5.

The first inorganic layer 171_5 may have a shape recessed toward the opening OP2 in correspondence with the shape of the upper surface of the third wavelength conversion pattern WCL3_5 recessed into the opening OP2. The first inorganic layer 171_5 may be disposed on an upper surface of the partition wall BK, and may also be disposed on an inclined side surface of the partition wall BK. The first inorganic layer 171_5 may be bent at an edge of the first inorganic layer 171_5 at which the upper surface and the side surface of the partition wall BK meet.

In one or more embodiments, due to a reverse-tapered structure of the partition wall BK, the first inorganic layer 171_5 may have a relatively small thickness in an area in contact with the side surface of the partition wall BK and an area in contact with the edge of the third wavelength conversion pattern WCL3_5 as compared with the other areas.

The display device 1_5 according to the present embodiment may improve the optical efficiency of light entering the wavelength conversion layer WCL from a light-emitting element layer 150 through a first thin-film encapsulation layer 160 disposed between the light-emitting element layer 150 and the wavelength conversion layer WCL and made of an inorganic material.

In the display device 1_5 according to the present embodiment, the first inorganic layer 171_5 disposed on an upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_5 may be viewed from various angles. In other words, a viewing angle of the display device 1_5 may be increased.

Figure 18:
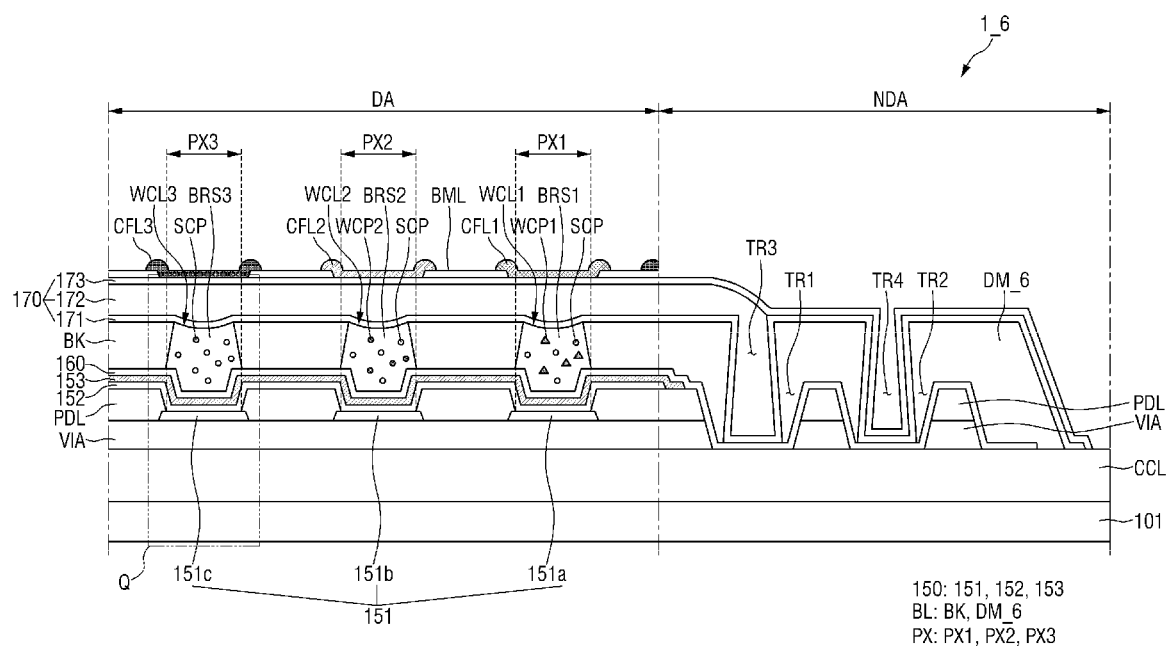
FIG. 18 is a cross-sectional view of a display device according to yet another embodiment.

FIG. 18 is a cross-sectional view of a display device according to yet another embodiment.

Referring to FIG. 18, a non-display area NDA of a display device 1_6 according to the present embodiment may have a different structure from the display device 1 according to an embodiment.

The display device 1_6 according to the present embodiment may further include a fourth trench TR4 disposed in the non-display area NDA and passing through a dam DM_6. The fourth trench TR4 may be located inside the dam DM_6.

The fourth trench TR4 may overlap a second trench TR2. The fourth trench TR4 may be disposed inside the second trench TR2. An inner width of the fourth trench TR4 may be less than an inner width of the second trench TR2. A bottom surface of the fourth trench TR4 may be located on a bottom surface of the second trench TR2. The inner width of the fourth trench TR4 may decrease from a lower side to an upper side.

A first inorganic layer 171 and a second inorganic layer 173 may be disposed (e.g., sequentially disposed) on the dam DM_6. In the fourth trench TR4 of the dam DM_6, the first inorganic layer 171 and the second inorganic layer 173 may be disposed inside the fourth trench TR4. The first inorganic layer 171 and the second inorganic layer 173 may be disposed to surround the fourth trench TR4.

The first inorganic layer 171 may be in contact with a first thin-film encapsulation layer 160 through the fourth trench TR4. In an area at which the first inorganic layer 171 is in contact with the first thin-film encapsulation layer 160, the second inorganic layer 173 may be disposed on the first inorganic layer 171.

The display device 1_6 according to the present embodiment may improve the optical efficiency of light entering the wavelength conversion layer WCL from a light-emitting element layer 150 through the first thin-film encapsulation layer 160 disposed between the light-emitting element layer 150 and the wavelength conversion layer WCL and made of an inorganic material.

In the display device 1_6 according to the present embodiment, the first inorganic layer 171 disposed on the upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_6 may be viewed from various angles. In other words, a viewing angle of the display device 1_6 may be increased.

In addition, the display device 1_6 according to the present embodiment may effectively prevent or substantially prevent a crack from occurring due to an external impact through a structure of the dam DM_6, which includes the fourth trench TR4.

Figure 19:
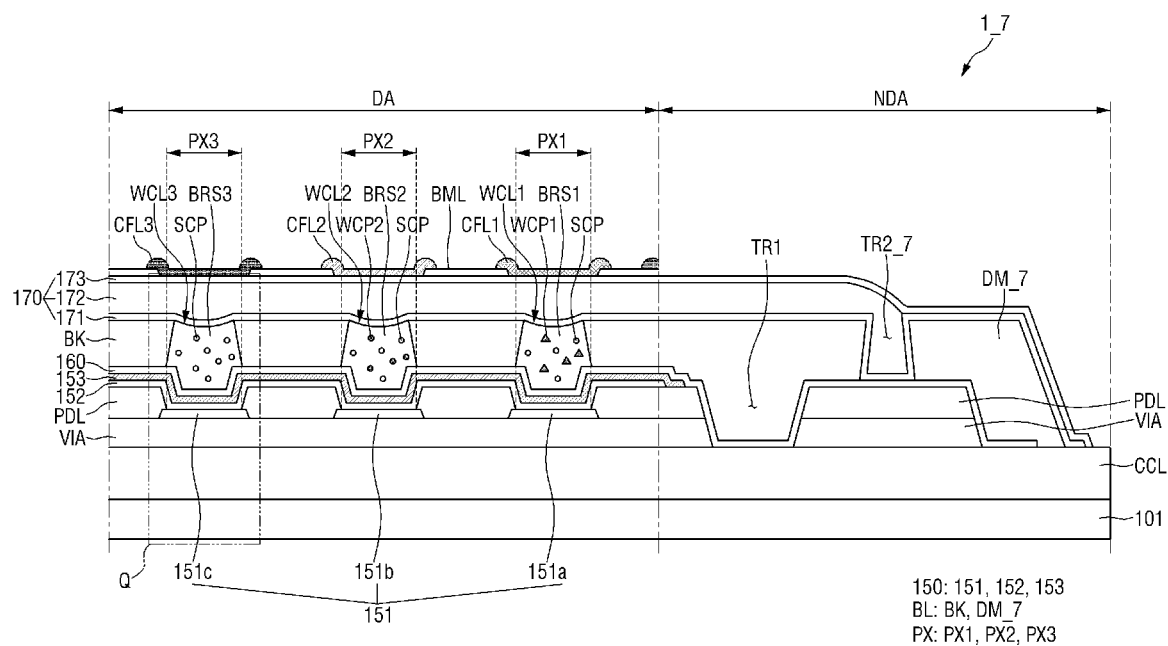
FIG. 19 is a cross-sectional view of a display device according to yet another embodiment.

FIG. 19 is a cross-sectional view of a display device according to yet another embodiment.

Referring to FIG. 19, a non-display area NDA of a display device 1_7 according to the present embodiment may have a different structure from the display device 1 according to an embodiment.

The display device 1_7 according to the present embodiment may include a second trench TR2_7 passing through a bank layer BL in the non-display area NDA and not overlapping (e.g., not overlapping in a thickness direction of the base substrate 101) a first trench TR1. A bottom surface of the second trench TR2_7 may be disposed on a pixel-defining film PDL. The second trench TR2_7 may be disposed further outward (e.g., outward relative to a center of the display device 1) than the first trench TR1. The bottom surface of the second trench TR2_7 may be located at a point higher than the bottom surface of the first trench TR1. In an embodiment, the bottom surface of the second trench TR2_7 may be further from the base substrate 101 than the bottom surface of the first trench TR1 is from the base substrate 101.

An inside of the second trench TR2_7 may be filled with a first organic layer 172. The second trench TR2_7 may serve to prevent or substantially prevent an organic material for forming the first organic layer 172 from overflowing to the outside when the first organic layer 172 is formed.

In the bank layer BL, a partition wall BK may be disposed on an inner side of the second trench TR2_7, and a dam DM_7 may be disposed on an outer side of the second trench TR2_7. The second trench TR2_7 may have a structure in which an inner width of the second trench TR2_7 decreases from a lower side to an upper side.

The display device 1_7 according to the present embodiment may improve the optical efficiency of light entering a wavelength conversion layer WCL from a light-emitting element layer 150 through a first thin-film encapsulation layer 160 disposed between the light-emitting element layer 150 and the wavelength conversion layer WCL and made of an inorganic material.

In the display device 1_7 according to the present embodiment, a first inorganic layer 171 disposed on an upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_7 may be viewed from various angles. In other words, a viewing angle of the display device 1_7 may be increased.

In addition, the display device 1_7 according to the present embodiment may have a structure in which a crack generated due to an external impact is doubly prevented or substantially prevented by including the second trench TR2_7 that does not overlap the first trench TR1.

Figure 20:
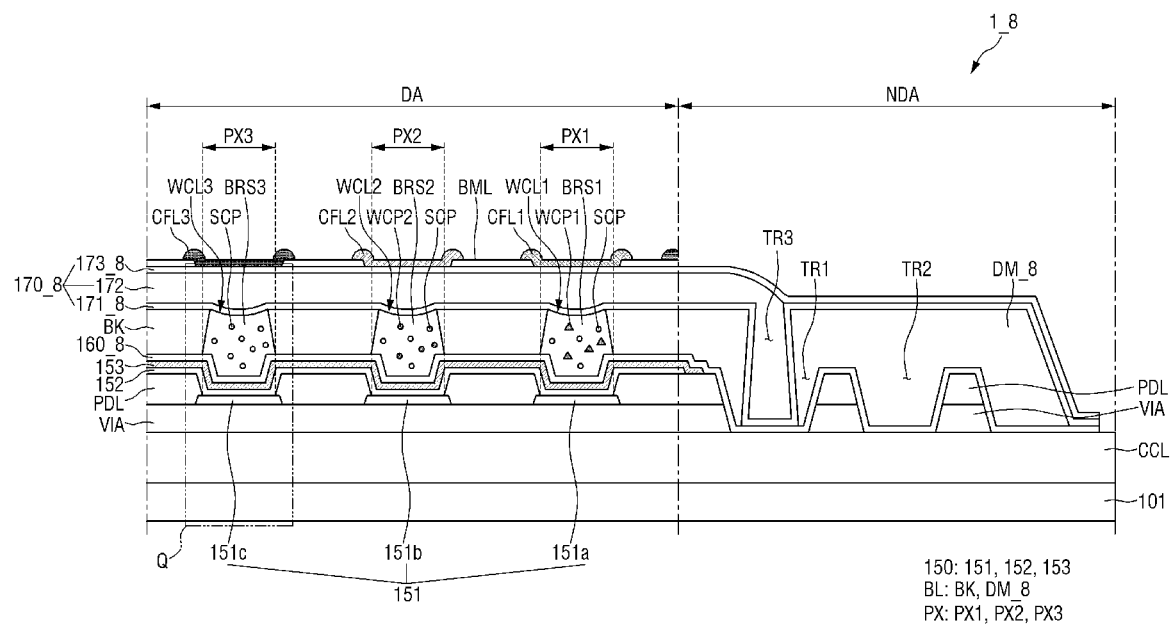
FIG. 20 is a cross-sectional view of a display device according to yet another embodiment.

FIG. 20 is a cross-sectional view of a display device according to yet another embodiment.

Referring to FIG. 20, a non-display area NDA of a display device 1_8 according to the present embodiment may have a different structure from the display device 1 according to an embodiment.

In the display device 1_8 according to the present embodiment, a first thin-film encapsulation layer 160_8 may be in contact with a first inorganic layer 171_8 at an outside of a dam DM_8. The first inorganic layer 171_8 and a second inorganic layer 173_8 may be disposed on an outer edge of the first thin-film encapsulation layer 160_8. A second thin-film encapsulation layer 170_8 may include thr first inorganic layer 171_8, the first organic layer 172, and a second inorganic layer 173_8.

The dam DM_8 may be disposed between the first thin-film encapsulation layer 160_8 and the first inorganic layer 171_8. The dam DM_8 may be encapsulated by the first thin-film encapsulation layer 160_8 and the first inorganic layer 171_8. The first thin-film encapsulation layer 160_8 may have a greater bonding force with a circuit layer CCL as compared with the first inorganic layer 171_8 and the second inorganic layer 173_8. In addition, the first thin-film encapsulation layer 160_8 has an excellent water vapor transmission rate as compared with the first inorganic layer 171_8 and the second inorganic layer 173_8, thereby exhibiting higher encapsulation performance. For example, the first thin-film encapsulation layer 160_8 may have a water vapor transmission rate of about $10^{-5}$ g/m$^2$/day or less.

The display device 1_8 according to the present embodiment may improve the optical efficiency of light entering a wavelength conversion layer WCL from a light-emitting element layer 150 through the first thin-film encapsulation layer 160_8 disposed between the light-emitting element layer 150 and the wavelength conversion layer WCL and made of an inorganic material.

In the display device 1_8 according to the present embodiment, the first inorganic layer 171_8 disposed on an upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_8 may be viewed from various angles. In other words, a viewing angle of the display device 1_8 may be increased.

In addition, the display device 1_8 may be encapsulated by the first thin-film encapsulation layer 160_8 at an outer edge of the first thin-film encapsulation layer 160_8 to form a more stable structure.

Figure 21:
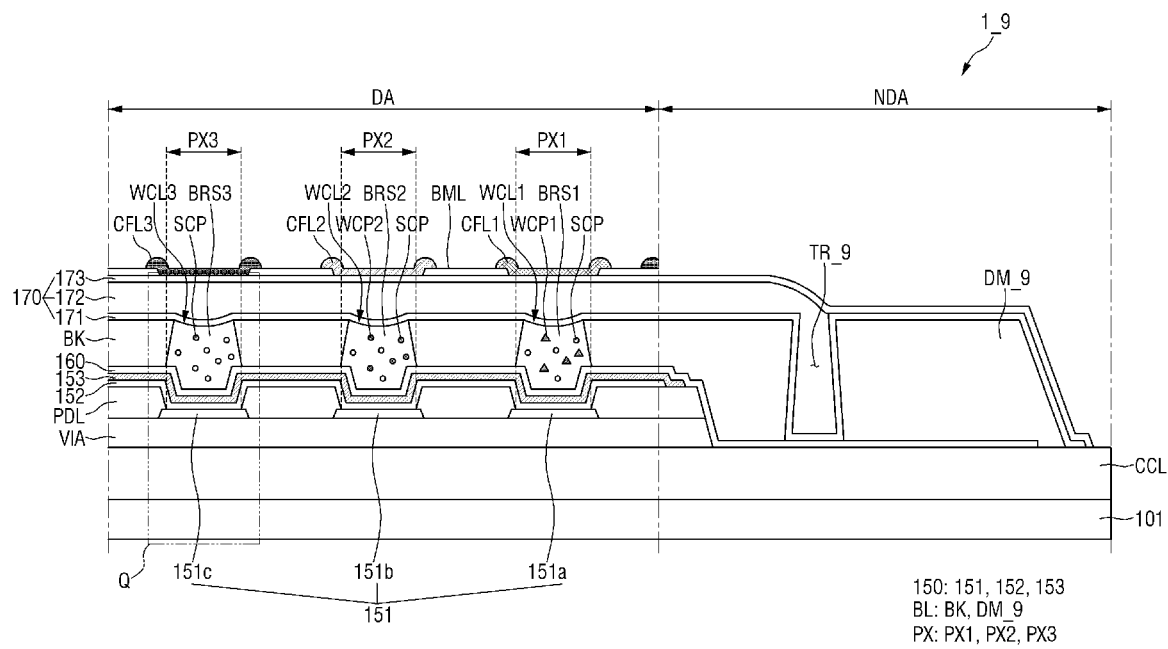
FIG. 21 is a cross-sectional view of a display device according to yet another embodiment.

FIG. 21 is a cross-sectional view of a display device according to yet another embodiment.

Referring to FIG. 21, a non-display area NDA of a display device 1_9 according to the present embodiment may have a different structure from the display device 1 according to an embodiment.

The display device 1_9 according to the present embodiment may include a trench TR_9 passing through a bank layer BL in the non-display area NDA. In the bank layer BL, a partition wall BK may be disposed on an inner side of the trench TR_9, and a dam DM_9 may be disposed on an outer side of the trench TR_9.

A bottom surface of the trench TR_9 may be disposed on a first thin-film encapsulation layer 160. A first inorganic layer 171 may be disposed on the bottom surface and a side surface of the trench TR_9, and an inside of the trench TR_9 may be filled with a first organic layer 172. The trench TR_9 may serve to prevent or substantially prevent an organic material for forming the first organic layer 172 from overflowing to the outside when the first organic layer 172 is formed. An inner width of the trench TR_9 may decrease from a lower side to an upper side.

The display device 1_9 according to the present embodiment may improve the optical efficiency of light entering a wavelength conversion layer WCL from a light-emitting element layer 150 through the first thin-film encapsulation layer 160 disposed between the light-emitting element layer 150 and the wavelength conversion layer WCL and made of an inorganic material.

In the display device 1_9 according to the present embodiment, the first inorganic layer 171 disposed on an upper surface of the wavelength conversion layer WCL and having a downward concave shape may provide the same effect as a concave lens to light emitted from the wavelength conversion layer WCL. That is, the light emitted from the wavelength conversion layer WCL may be dispersed and emitted. Accordingly, the light emitted from the display device 1_9 may be viewed from various angles. In other words, a viewing angle of the display device 1_9 may be increased.

In addition, the display device 1_9 according to the present embodiment may be manufactured through a simple process by including a single trench TR_9.

A display device according to an embodiment can improve optical efficiency of light entering a wavelength conversion member from a light-emitting element by encapsulating the light-emitting element through a thin-film encapsulation layer that is disposed between the light-emitting element and the wavelength conversion member and made of an inorganic material.

A display device according to an embodiment enables an image provided by the display device to be viewed from various angles by providing the same effect as a concave lens to light emitted from a wavelength conversion member using an inorganic film disposed on an upper surface of the wavelength conversion member and having a downward concave shape.

Effects according to the embodiments are not limited by the content exemplified above, and more various effects are included in the present specification.

In concluding the detailed description, those skilled in the art will appreciate that many variations and modifications can be made to embodiments without substantially departing from the principles of the present disclosure. Therefore, the disclosed embodiments of the present disclosure are used in a generic and descriptive sense only and not for purposes of limitation.

While the present disclosure has been particularly shown and described with reference to some embodiments thereof, it will be understood by those of ordinary skill in the art that various changes in form and details may be made therein without departing from the spirit and scope of the present disclosure as set forth in the following claims and their equivalents.

What is claimed is:
1. A display device comprising:
a substrate comprising a display area in which a plurality of pixels are located;
a pixel-defining film arranged along a boundary of a pixel of the plurality of pixels;
a light-emitting element layer on the substrate;
a first thin-film encapsulation layer that is on the light-emitting element layer, has an upper surface conforming to an upper surface of the light-emitting element layer, and comprises a recessed portion;
a bank layer on the first thin-film encapsulation layer and having an opening overlapping the recessed portion, the first thin-film encapsulation layer being between the pixel-defining film and the bank layer;
a wavelength conversion layer in the opening on the first thin-film encapsulation layer and at least partially in the recessed portion;

a first inorganic layer on the bank layer and the wavelength conversion layer;
an organic layer on the first inorganic layer; and
a second inorganic layer on the organic layer.

2. The display device of claim 1, wherein the first thin-film encapsulation layer is substantially uniform in thickness.

3. The display device of claim 2, wherein a lower surface of the wavelength conversion layer conforms to the upper surface of the light-emitting element layer.

4. The display device of claim 1, wherein the substrate further comprises a non-display area around the display area, and
wherein the first inorganic layer and the second inorganic layer contact each other in the non-display area.

5. The display device of claim 4, wherein the first thin-film encapsulation layer and the first inorganic layer contact each other in the non-display area.

6. The display device of claim 1,
wherein the pixel-defining film is arranged along a boundary of each of the pixels and partially overlaps the bank layer.

7. The display device of claim 1, wherein a width of the opening decreases toward an upper side.

8. The display device of claim 7, wherein the bank layer comprises a partition wall having a reverse-tapered structure.

9. The display device of claim 1, wherein the opening and the recessed portion are spatially connected to each other.

10. A display device comprising:
a substrate;
a light-emitting element layer on the substrate;
a first thin-film encapsulation layer that is on the light-emitting element layer, has an upper surface conforming to an upper surface of the light-emitting element layer, and comprises a recessed portion;
a bank layer on the first thin-film encapsulation layer and having an opening overlapping the recessed portion;
a wavelength conversion layer in the opening on the first thin-film encapsulation layer and at least partially in the recessed portion;
a first inorganic layer on the bank layer and the wavelength conversion layer;
an organic layer on the first inorganic layer; and
a second inorganic layer on the organic layer,
wherein the wavelength conversion layer comprises a concave upper surface.

11. The display device of claim 10, wherein a refractive index of the first inorganic layer is lower than a refractive index of the wavelength conversion layer.

12. A display device comprising:
a substrate comprising an area in which a plurality of pixels are located;
a pixel-defining film arranged along a boundary of each of the pixels;
a light-emitting element layer on the substrate so as to cover the pixel-defining film;
a first thin-film encapsulation layer on the light-emitting element layer, the first thin-film encapsulation layer comprising a recessed portion not overlapping the pixel- defining film in a thickness direction of the substrate;
a wavelength conversion layer on the first thin-film encapsulation layer, the wavelength conversion layer being at least partially in the recessed portion;
a first inorganic layer on the wavelength conversion layer;
an organic layer on the first inorganic layer; and
a second inorganic layer on the organic layer,
wherein the wavelength conversion layer comprises a concave upper surface.

13. The display device of claim 12, wherein an upper surface of the first thin-film encapsulation layer conforms to an upper surface of the light-emitting element layer.

14. The display device of claim 12, wherein the first thin-film encapsulation layer is substantially uniform in thickness.

15. The display device of claim 14, wherein a lower surface of the wavelength conversion layer conforms to an upper surface of the light-emitting element layer.

16. A display device comprising:
a substrate comprising an area in which a plurality of pixels are located;
a pixel-defining film arranged along a boundary of each of the pixels;
a light-emitting element layer on the substrate so as to cover the pixel-defining film:
a first thin-film encapsulation layer on the light-emitting element layer, the first thin-film encapsulation layer comprising a recessed portion not overlapping the pixel- defining film in a thickness direction of the substrate;
a wavelength conversion layer on the first thin-film encapsulation layer, the wavelength conversion layer being at least partially in the recessed portion;
a first inorganic layer on the wavelength conversion layer;
an organic layer on the first inorganic layer;
a second inorganic layer on the organic layer; and
a bank layer on the first thin-film encapsulation layer, the bank layer having an opening partially overlapping the recessed portion and spatially connected thereto,
wherein at least a portion of the wavelength conversion layer is in the opening.

17. The display device of claim 16, wherein a width of the opening decreases toward an upper side.

18. The display device of claim 17, wherein the bank layer comprises a partition wall having a reverse-tapered structure.

19. A method of manufacturing a display device, the method comprising:
providing a substrate comprising a display area in which a plurality of pixels are to be located; forming a pixel-defining film along a boundary of a pixel of the plurality of pixels; forming a light-emitting element layer on the substrate;
forming a first thin-film encapsulation layer, on the light-emitting element layer, having an upper surface conforming to an upper surface of the light-emitting element layer and comprising a recessed portion;
forming a bank layer having an opening on the first thin-film encapsulation layer, the first thin-film encapsulation layer being between the pixel-defining film and the bank layer;
inkjet printing a wavelength conversion layer on the recessed portion and the opening;
forming a first inorganic layer on the bank layer and the wavelength conversion layer;
forming an organic layer on the first inorganic layer; and
forming a second inorganic layer on the organic layer.

20. The method of claim 19, wherein the opening exposes the recessed portion, and wherein the bank layer comprises a partition wall having a reverse-tapered structure.

* * * * *